(12) United States Patent
Pentikäinen et al.

(10) Patent No.: US 11,388,815 B2
(45) Date of Patent: Jul. 12, 2022

(54) ELECTRONIC FOIL

(71) Applicant: TEKNOLOGIAN TUTKIMUSKESKUS VTT OY, Espoo (FI)

(72) Inventors: Vesa Pentikäinen, Oulu (FI); Kimmo Jokelainen, Oulu (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 158 days.

(21) Appl. No.: 16/643,125

(22) PCT Filed: Aug. 31, 2018

(86) PCT No.: PCT/FI2018/050618
§ 371 (c)(1),
(2) Date: Feb. 28, 2020

(87) PCT Pub. No.: WO2019/043298
PCT Pub. Date: Mar. 7, 2019

(65) Prior Publication Data
US 2020/0260567 A1   Aug. 13, 2020

(30) Foreign Application Priority Data
Sep. 1, 2017   (FI) ........................... 20175786

(51) Int. Cl.
| H05K 1/00 | (2006.01) |
| H05K 1/02 | (2006.01) |
| H05K 1/11 | (2006.01) |
| H05K 1/14 | (2006.01) |
| H05K 3/36 | (2006.01) |

(52) U.S. Cl.
CPC ............. H05K 1/028 (2013.01); H05K 1/118 (2013.01); H05K 1/147 (2013.01); H05K 3/365 (2013.01);
(Continued)

(58) Field of Classification Search
CPC ........ H05K 1/028; H05K 1/118; H05K 3/365; H05K 2201/048; H05K 2201/053; H05K 2201/058
(Continued)

(56) References Cited

U.S. PATENT DOCUMENTS

| 3,857,397 A | 12/1974 | Brosseau |
| 4,484,039 A * | 11/1984 | Salie .................... H01H 13/702 200/292 |

(Continued)

FOREIGN PATENT DOCUMENTS

| CN | 1305628 A * | 7/2001 | ........... G11B 25/043 |
| EP | 1 839 559 | 10/2007 | |

(Continued)

OTHER PUBLICATIONS

International Search Report and Written Opinion of the ISA for PCT/FI2018/050618, dated Dec. 7, 2018, 14 pages.
Search Report for FI20175786, dated Dec. 8, 2017, 2 pages.

*Primary Examiner* — Andargie M Aychillhum
(74) *Attorney, Agent, or Firm* — Nixon & Vanderhye PC

(57) ABSTRACT

A flexible electronic foil (1,1',1") comprising a flexible substrate (2) and at least one electrically conducive portion (3) arranged to the substrate (2). The foil (1,1',1") comprises mechanical fastening means (6,6',7) for mechanical fastening of the electronic foil (1,1',1"), the mechanical fastening means being part of the substrate (2) of the electronic foil (1,1',1").

18 Claims, 25 Drawing Sheets

(52) U.S. Cl.
CPC . *H05K 2201/048* (2013.01); *H05K 2201/053* (2013.01); *H05K 2201/058* (2013.01); *H05K 2201/09081* (2013.01); *H05K 2201/10568* (2013.01); *H05K 2201/209* (2013.01); *H05K 2203/0278* (2013.01); *H05K 2203/167* (2013.01)

(58) Field of Classification Search
USPC ........................................................ 361/749
See application file for complete search history.

(56) References Cited

U.S. PATENT DOCUMENTS

| | | |
|---|---|---|
| 5,110,298 A | 5/1992 | Dorinski et al. |
| 7,531,752 B2 * | 5/2009 | Hirakata ................ H05K 1/028 |
| | | 174/254 |
| 2009/0203244 A1 | 8/2009 | Den Toonder et al. |
| 2010/0093192 A1 | 4/2010 | Lin |
| 2010/0202119 A1 | 8/2010 | Nagami et al. |
| 2010/0263462 A1 | 10/2010 | Nakamura |
| 2012/0087136 A1 | 4/2012 | Kuwahara |
| 2012/0113606 A1 | 5/2012 | Preuschl |
| 2014/0065853 A1 | 3/2014 | Murakami |
| 2016/0014900 A1 * | 1/2016 | Schmidt .................. H05K 1/16 |
| | | 361/760 |

FOREIGN PATENT DOCUMENTS

| | | |
|---|---|---|
| JP | S60-113674 | 8/1985 |
| KR | 10-2010-0127527 | 12/2010 |

\* cited by examiner ately also conductive tapes or glues are used for
ELECTRONIC FOIL This application is the U.S. national phase of International Application No. PCT/FI2018/050618 filed 31 Aug. 2018, which designated the U.S. and claims priority to FI Patent Application No. 20175786 filed 1 Sep. 2017, the entire contents of each of which are hereby incorporated by reference.

FIELD OF THE INVENTION

The invention relates to flexible electronics technologies and more particularly to flexible electronic foils comprising a flexible substrate and at least one electrically conductive portion arranged to the substrate.

BACKGROUND OF THE INVENTION

Flexible electronics technologies enable manufacturing of thin, flexible and cost-efficient electronics devices or products. Presently used solutions for joining electronic foils to these devices or to each other are based for example on rigid connectors that are either crimped or glued to the foil. Alternatively also conductive tapes or glues are used for joining the foils to these devices or to each other.

Using of the rigid connectors for joining the electronic foils ruins many of the benefits provided by the flexible electronic technologies. These connectors makes the intended structure much thicker but still not guarantee mechanical durability of the structure. The connectors also increase the costs remarkably. These connecters itself must also be connected to the foils what also adds extra components in the structure and the costs thereof.

The connectors cannot typically also be made wide enough to direct uniform stretching force to the foil. Most of the presently available commercial connectors are designed to be used with traditional rigid printed circuit boards or flexible solderable printed circuit boards. The connectors also require applying additional processes and manufacturing phases to the production line that are not practical and compatible with the streamlined flexible electronics manufacturing flow.

The conductive tapes or glues between the foils or between the foil and the device can provide instantaneously electrical connectivity. However, they have a limited mechanical strength, especially under static loading. The electrical properties of the conductive tapes and glues also change during aging. The tapes and glues are also unpractical, especially in field use applications. For example the glues can easily spill outside the intended application area and the tapes are difficult to align properly. The tapes and glues provide also a permanent connection that cannot be easily unmounted if at all without breaking the structure and at least drastically weakening the performance.

Same kind of limitations are also relevant for lamination based joining technologies, which additionally require specific lamination machines with heating and pressure devices.

BRIEF DESCRIPTION OF THE INVENTION

An object of the present invention is to provide a novel solution for joining of electronic foils.

The invention is characterized by the features of the independent claims.

The flexible electronic foil comprises a flexible substrate and at least one electrically conductive portion arranged to the substrate. The electronic foil further comprises mechanical fastening means that are part of the substrate for mechanical fastening of the electronic foil. The mechanical fastening means are intended to be used for joining or fastening or attaching the electronic foil mechanically for example to an object intended to provide a counterpart for the electronic foil.

The joining solution provided by disclosed electronic foil is cost efficient to manufacture because there is no need for any additional parts to provide the joint of the electronic foil to an object providing a counterpart for the electronic foil. The joining solution described not necessarily only join or fasten the two objects mechanically together but at the same time it may also be used to align the objects to be joint together and possible electrically conductive portions therein relative to each other.

Some embodiments of the invention are disclosed in the dependent claims.

BRIEF DESCRIPTION OF THE DRAWINGS

In the following the invention will be described in greater detail by means of preferred embodiments with reference to the accompanying drawings, in which.

For the sake of clarity, the figures show some embodiments of the invention in a simplified manner. Like reference numerals identify like elements in the figures.

DETAILED DESCRIPTION OF THE INVENTION

Figure 1:
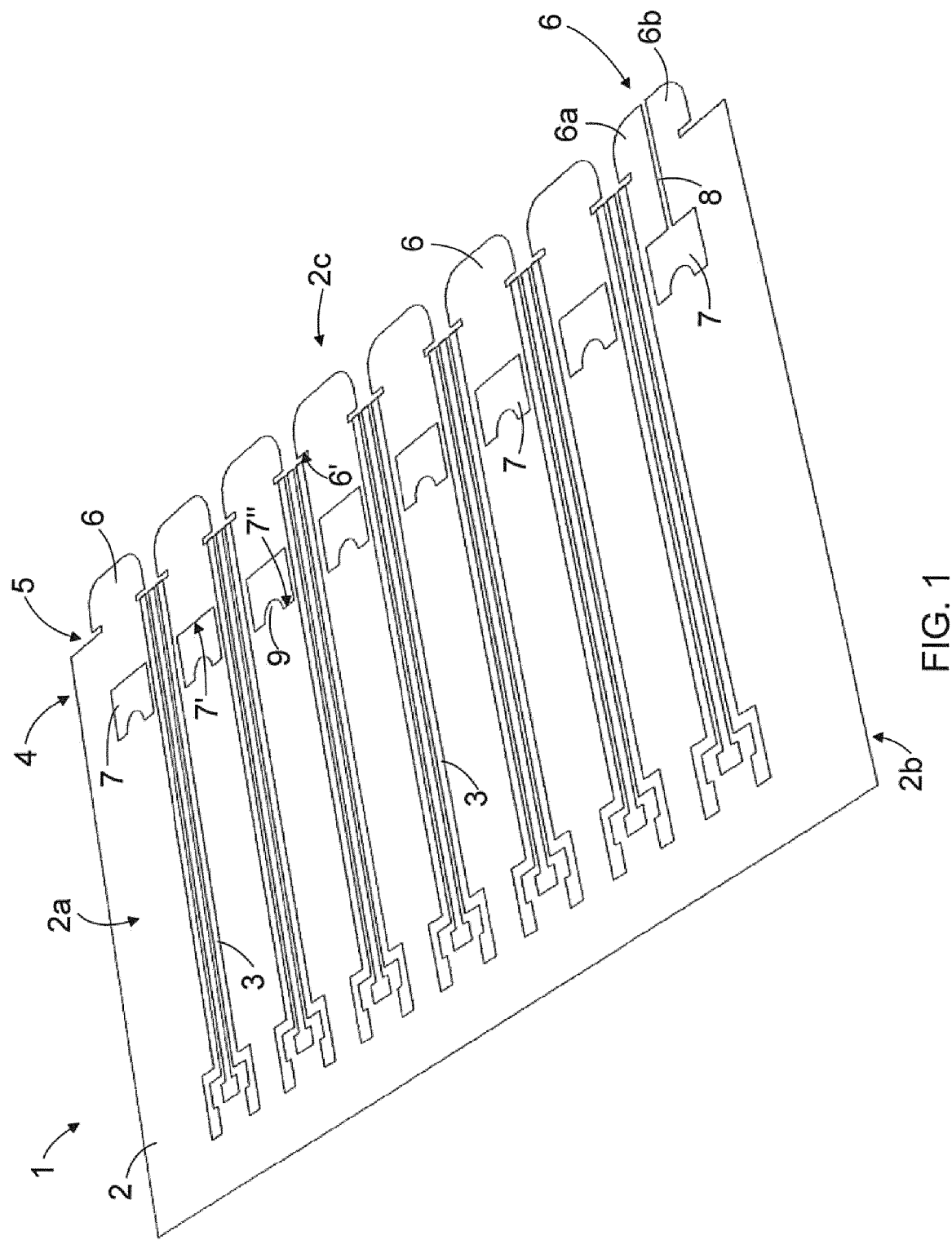
FIG. 1 shows schematically an electronic foil.
Figure 2:
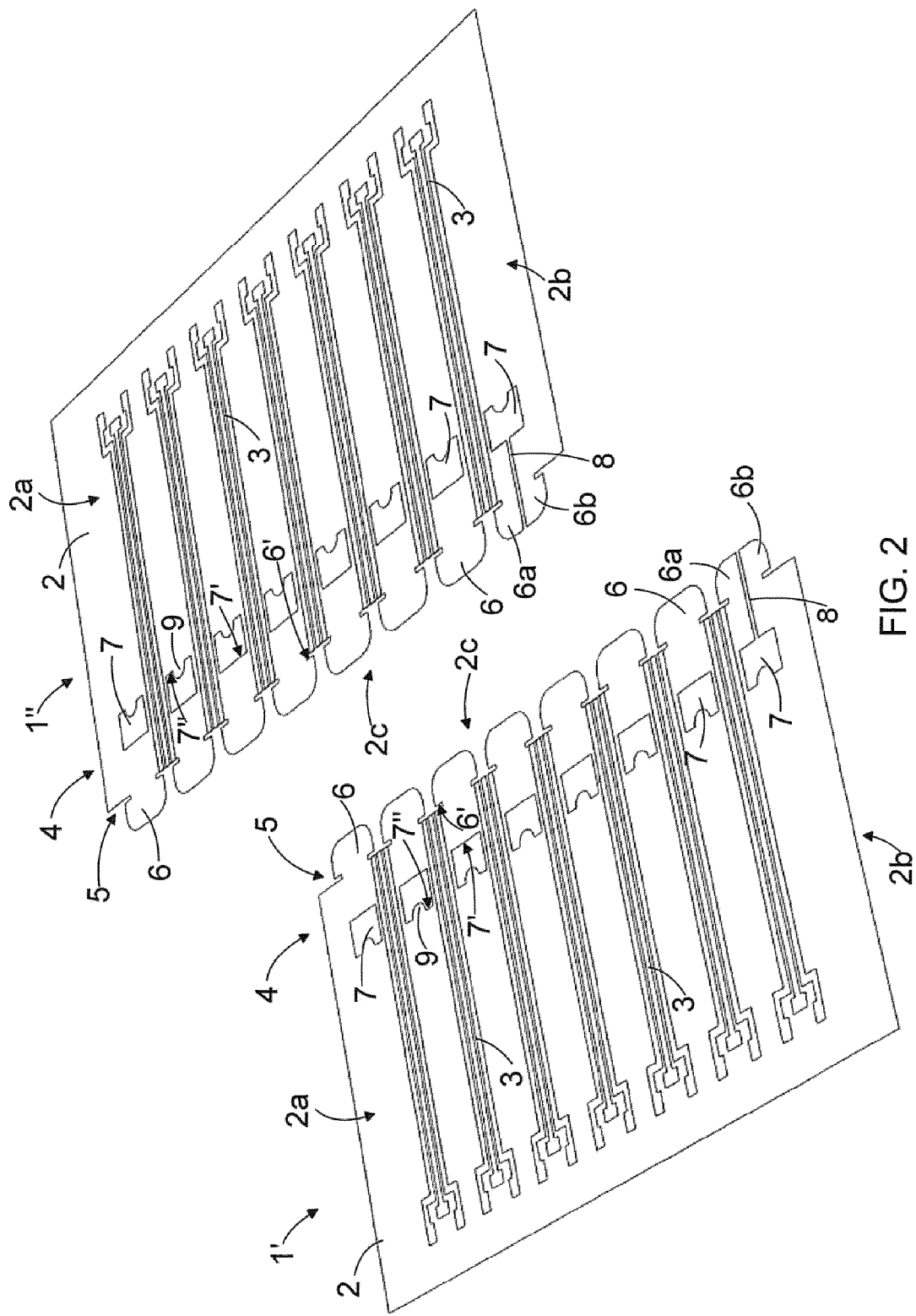
FIG. 2 shows schematically two electronic foils substantially similar to that of FIG. 1 at a distance apart from each other.
Figure 3:
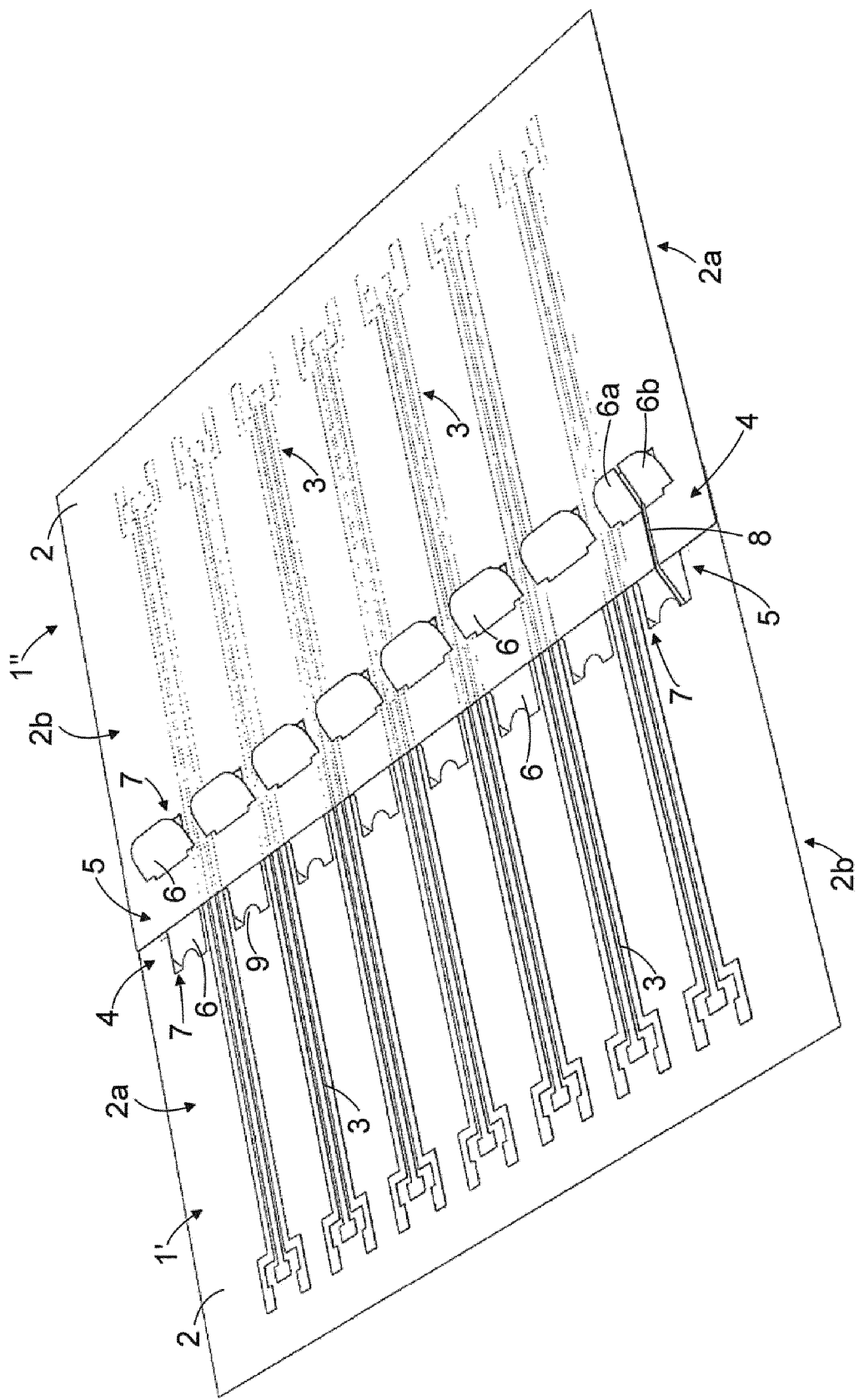
FIG. 3 shows schematically the electronic foils of FIG. 2 as joined mechanically and electrically to each other.
Figure 4:
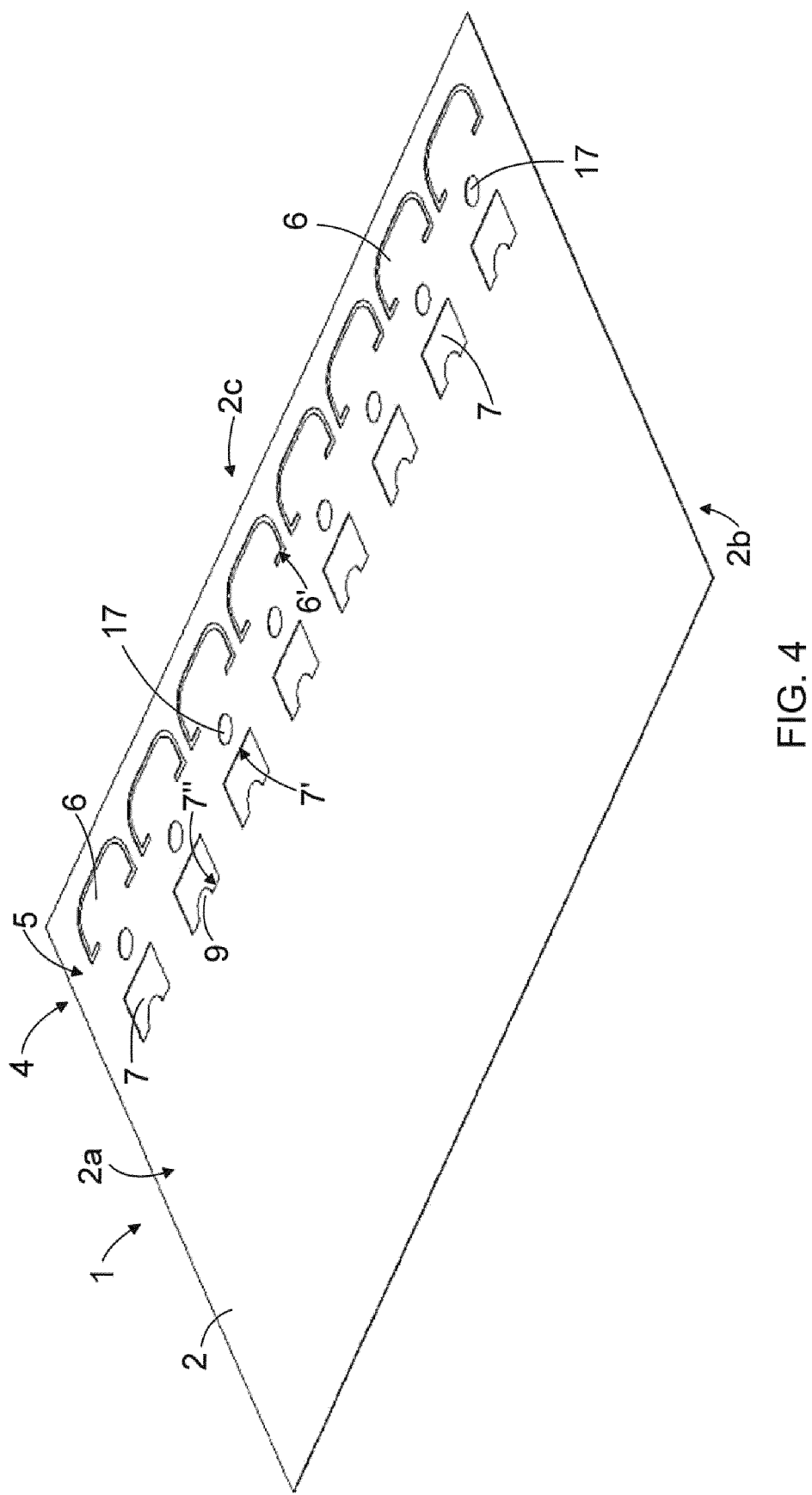
FIG. 4 shows schematically another electronic foil.
Figure 5:
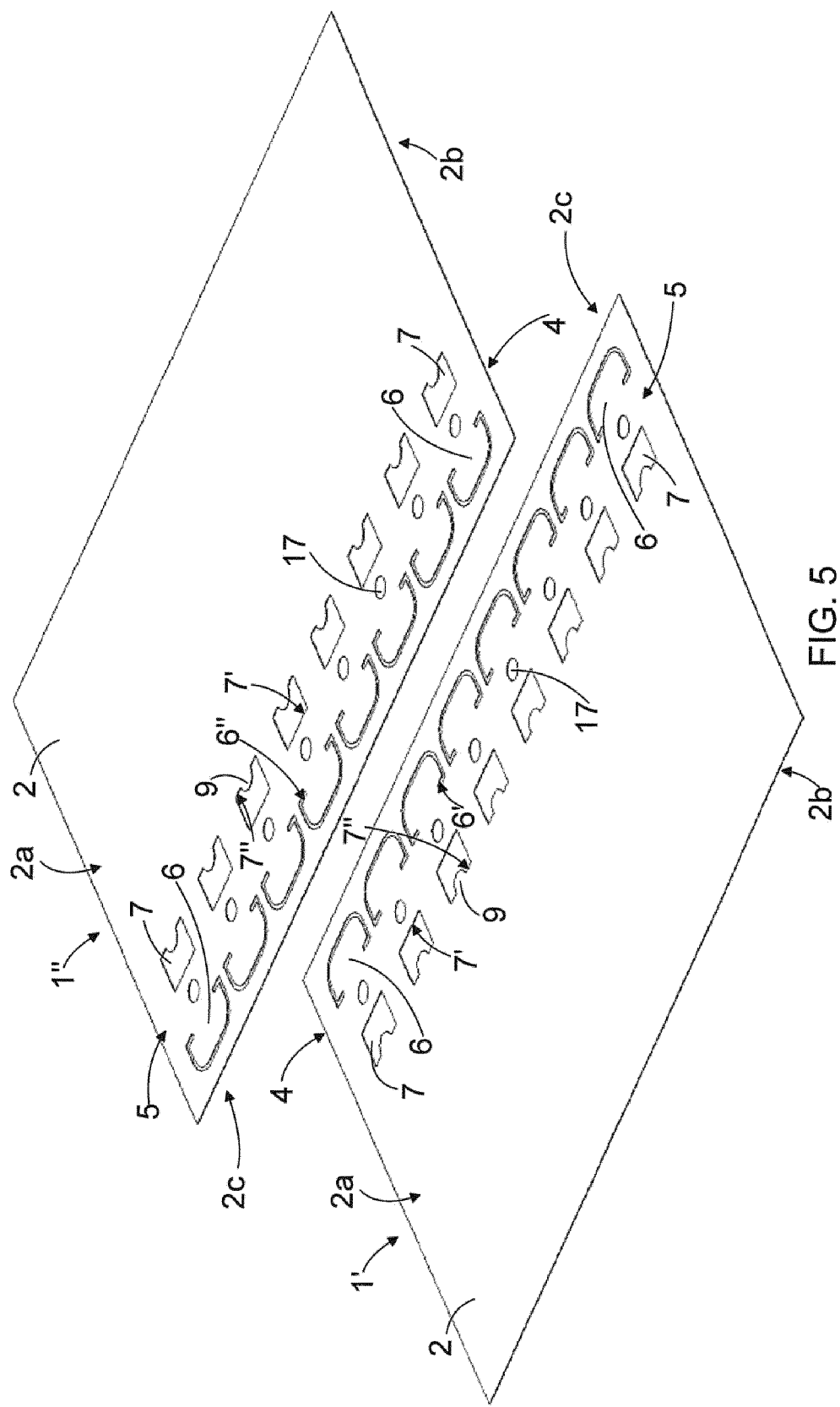
FIG. 5 shows schematically two electronic foils of FIG. 4 at a distance apart from each other.

FIG. 1 shows schematically a flexible electronic foil 1. FIG. 2 shows schematically two flexible electronic foils 1',1" substantially similar to that of FIG. 1, the first electronic foil 1' and the second electronic foil 1" being laid next to each other at a distance apart from each other. FIG. 3 shows schematically the electronic foils 1',1" of FIG. 2 as joined or fastened or attached to each other. FIG. 4 shows schematically another flexible electronic foil 1 and FIG. 5 shows schematically two flexible electronic foils 1',1" similar to that of FIG. 4 laid next to each other at a distance apart from each other.

The electronic foil 1 comprises a flexible substrate 2. The flexible substrate 2 is a sheet-like part or element comprising a first surface 2a or a first side 2a and a second surface 2b or a second side 2b that faces to a direction being substantially opposite to that of the first side 2a. In the positions shown in FIGS. 1, 2, 4 and 5 the first side 2a of the substrate 2 is directed upwards, and the second side 2b of the substrate 2 is directed downwards and in FIG. 3 the first side 2a of the first electronic foil 1' is directed downwards and the second side 2b of the second electronic foil 1" is directed upwards.

Further the electronic foil 1 comprises a number of electrically conductive conductors 3 arranged to the substrate 2. The one or more electrically conductive conductors 3 arranged to the substrate 2 provide an electrical circuit in the electronic foil 1 and the flexible substrate 2 provides a base onto which the electrical circuit and possible electronic components are arranged to. At least some of the electrically conductive conductors 3 may be arranged very close to each other so that these electrically conductive conductors 3 provide one or more conductor buses. The one or more electrically conductive conductors 3 may be arranged only either to the first side 2a of the substrate 2 or to the second side 2b of the substrate 2, whereby the electronic foil 1 is considered to be a one-sided electronic foil 1 if the implementation of conductors 3 is considered to. Alternatively the one or more electrically conductive conductors 3 may be arranged both to the first side 2a of the substrate 2 and to the second side 2b of the substrate 2, whereby the electronic foil 1 is considered to be a two-sided electronic foil 1 if the implementation of the conductors 3 is considered to. For the sake of clarity, the electrically conductive conductors 3 are omitted in FIGS. 4 and 5.

The flexible electronic foil or the flexible substrate 2 refer to an electronic foil 1 or a substrate 2, which is able to bent at least to some extent so that the foil 1 or the substrate 2 does not disrupt or break due to the bending. The materials like that may comprise for example different kind of plastic-based materials, such as polyimide (PI), polyethylene terephthalate (PET) or ethylene tetrafluoroethylene (ETFE). The substrate 2 may have any desired shape, i.e. the substrate 2 may be cut to any desired shape. Therefore edges of the substrate 2 may comprise straight and/or curved portions, for example. Alternatively the substrate 2 may be formed by additive manufacturing methods, such as 3D-printing. The thickness of the substrate 2 may for example be 50-250 micrometres but the substrate 2 may also be thicker or thinner than that.

There are a number of materials to be used for electrically conductive conductors 3 as well as a number of ways to arrange or apply the electrically conductive conductors 3 to the substrate 2.

According to an embodiment the electrically conductive conductors 3 may be of an electrically conductive ink, such as silver based ink material that is printed to the surface of the flexible substrate 2.

According to another embodiment the electrically conductive conductor 3 may be of an electrically conductive ink that is pressed to the surface of the flexible substrate 2.

According to still another embodiment the electrically conductive conductor 3 may be of copper or aluminium, for example, whereby there may be a layer of copper or aluminium on the surface of the substrate 2 and part of it is removed by utilizing techniques of exposure to light and etching for providing the conductors 3. Other materials for the electrically conductive conductors 3 and/or techniques for providing the electrically conductive conductors 3 to the surface of the substrate 2 are also possible.

The electrically conductive conductors 3 are an embodiment of electrically conductive portions arranged to the substrate 2. Electrically conductive portions may be arranged to the substrate 2 also for example with different kind of electrically active materials applied or arranged to the substrate 2, whereby the electrically active material may even form a part of the substrate 2. In the following examples it is assumed, for the sake of clarity, that the electrically conductive portions in the substrate 2 of the electronic foil 1 are provided by electrically conductive conductors 3.

The electronic foil 1 comprises, depending on for example of a shape of a substrate 2 or an intended use of the electronic foil 1, a number of joint areas 4 comprising mechanical fastening means 5 or fasteners 5 by means of which the electronic foil 1 may be joined or fastened or attached mechanically to another similar or different electronic foil or to another object where the electronic foil 1 in question is intended to be used. The at least one joint area 4 of the electronic foil 1 is arranged to comprise mechanical fastening means 5 that are part of the substrate 2. The mechanical fastening means 5 are thus intended to join or fasten or attach the electronic foil 1 mechanically to another object provided with compatible mechanical fastening means. The mechanical fastening means 5 are also intended to align the electronic foil 1 relative to the other object, as well as to align the electrically conductive portions of the electronic foil 1 relative to the electrically conductive portions in the other object, if there are any electrically conductive portions in the other object. In this joint or fastening arrangement the other object thus provides a counterpart for the electronic foil 1 in question. The other object may for example be another electronic foil similar to that disclosed herein, another electronic foil or circuit board that is different from the electronic foil disclosed herein, an electronic device wherein the electronic foil 1 in question is to be utilized to, or another article or device wherein the electronic foil 1 in question is to be utilized to. Preferably the counterpart for the electronic foil 1 is substantially thin but it does not necessarily need to be flexible.

According to an embodiment the mechanical fastening means 5 of the electronic foil 1 are part of the substrate 2 such that the mechanical fastening means 5 are integral parts of the substrate 2 and formed thereof. According to an embodiment this type of mechanical fastening means 5 may be provided by cutting the substrate material, for example by laser cutting or mechanical punching.

According to an embodiment the mechanical fastening means 5 of the electronic foil 1 are part of the substrate 2 such that they are integral parts of the substrate 2 but made or formed of material that is different from the material of other portions of the substrate 2. According to an embodiment these types of mechanical fastening means 5 may be provided by additive manufacturing methods, such as 3D-printing, whereby the joint area 4 of the substrate 2 comprising the fastening means 5 could be made of material different than the other parts of the substrate 2.

Referring back to the FIGS. 1-5, the fastening means 5 disclosed in Figures comprises a number of tabs 6 extending away from a central part or a central region of the electronic foil 1, the tabs 6 being integral parts of the substrate 2 and formed thereof. Further the fastening means 5 disclosed in the FIGS. 1-5 comprises a number of openings 7 arranged through the substrate 2 of the electronic foil 1, the openings 7 thus being formed of the substrate 2 and positioned on the side of the central part of the electronic foil 1 relative to the tabs 6, at opposite positions of the tabs 6 and at a distance apart from the tabs 6. The tabs 6 and the openings 7 are designed or shaped to be compatible so that the tabs 6 of a first electronic foil 1', as shown in FIGS. 2 and 3, or alternatively in FIGS. 4 and 5, co-operate with the openings 7 provided in a second electronic foil 1" so as to provide a mechanical fastening therebetween when the tabs 6 in the first electronic foil 1' are inserted into the openings 7 in the second electronic foil 1". Furthermore the openings 7 in the first electronic foil 1' co-operate with the tabs 6 provided in the second electronic foil 1" so as to provide a mechanical locking therebetween when the tabs 6 in the second electronic foil 1" are inserted into the openings 7 in the first electronic foil 1'. In the joining or fastening arrangement disclosed in FIGS. 2 and 3, or alternatively in FIGS. 4 and 5, the second electronic foil 1" may be said to provide an object that is a counterpart for the first electronic foil 1'.

In order of the tabs 6 and the openings 7 being compatible to each other the tabs 6 and the openings 7 do not necessarily need to be of the same size and/or shape as long as the mechanical fastening between the tabs 6 and the openings 7 takes place. In the embodiments shown in FIGS. 1-5 the mechanical fastening takes place between an edge 6' of a tab 6 facing towards a respective opening 7 in one electronic foil 1, 1', 1" and an edge 7' of an opening 7 facing towards a respective tab 6 in the other electronic foil 1, 1', 1", i.e. between the edge 6' of the tab 6 in the first electronic foil 1' and the edge 7' of the opening 7 in the other electronic foil 1". The edges 6' of the tabs 6 in the first electronic foil 1' and the edges 7' of the openings 7 in the second electronic foil 1" form or provide counterparts that lock the first electronic foil 1' and the second electronic foil 1" to each other substantially absence of play in one direction. Similarly, the edges 6' of the tabs 6 in the second electronic foil 1" and the edges 7' of the openings 7 in the first electronic foil 1" form or provide another counterparts that lock the first electronic foil 1' and the second electronic foil 1" to each other substantially absence of play in the other direction. In a similar way, other edges of the tabs in one electronic foil and respective edges of the openings may form or provide further counterparts locking the electronic foils to each other substantially absence of play in other directions.

In the electronic foil 1, 1', 1" disclosed in FIGS. 1-3 most of the tabs 6 are formed of one piece and most of the openings 7 are closed openings in such a way that all the edges of the opening 7 are continuous. However, in the tabs opening-pair at the lower edge of the electronic foil 1, 1', 1" there is a slit 8 extending from the edge 7' of the opening 7 facing towards the respective tab 6 up to the outer end of the respective tab 6 so that the edge 7' of the opening 7 is non-continuous but divided into two parts, and the tab 6 is not uniform but divided into two tab parts 6a, 6b. The embodiment of the tab-opening-pair like this is somewhat more flexible that the other tab-opening-pairs in the electronic foils 1, 1', 1" which may be helpful when fastening the foils together.

In the embodiment of FIGS. 1-5 there is only one joint area 4 in the electronic foil 1, 1', 1" but the number of the joint areas 4 in a single electronic foil 1, 1', 1" may vary.

In the embodiment of FIGS. 1-3 the joint area 4 is arranged to extend up to a distance from the edge 2c of the substrate 2 towards the central part of the electronic foil 1, 1', 1". The tabs 6 are arranged exactly at the edge 2c of the substrate 2 of the electronic foil 1, 1', 1" at a distance apart from each other along the edge 2c, whereby the tabs 6 may be said to be arranged to provide or form a part of the edge 2c of the substrate 2. The positioning of the adjacent tabs 6 in FIGS. 1, 2 and 3 is thus arranged to follow a direction of a straight line as determined by the edge 2c of the substrate 2 of the electronic foil 1, 1', 1".

In the embodiment of FIGS. 4 and 5 the joint area 4 of the electronic foil 1', 1" is arranged to locate at a distance apart from the edge 2c of the substrate 2 of the electronic foil 1', 1" towards the central part of the electronic foil 1', 1". The tabs 6 are thus arranged at a distance apart from the edge 2c of the substrate 2. The tabs 6 are also arranged at a distance apart from each other along the direction determined by the edge 2c. The positioning of the adjacent tabs 6 in FIGS. 1, 2 and 3 is thus arranged to follow a direction of a straight line as determined by the edge 2c of the substrate 2 of the electronic foil 1, 1', 1".

Figure 17:
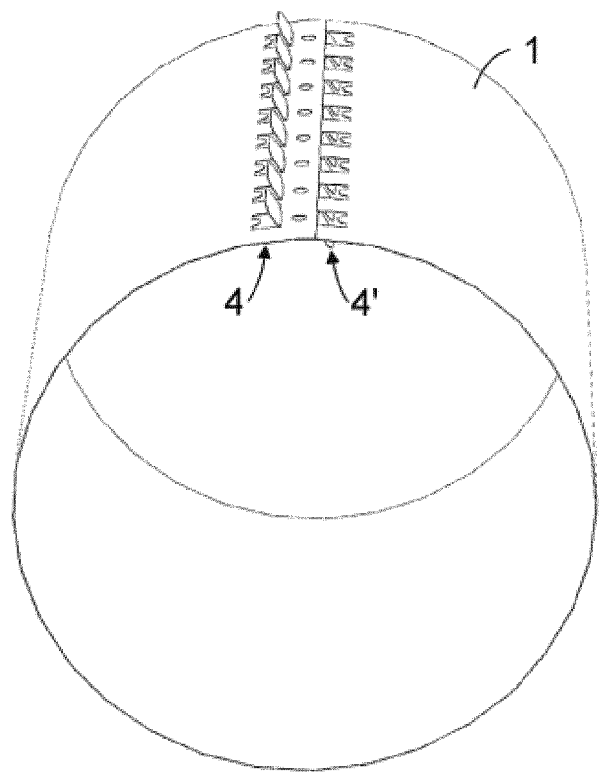
FIG. 17 discloses schematically a three-dimensional structure implemented with a single flexible electronic foil.
Figure 18:
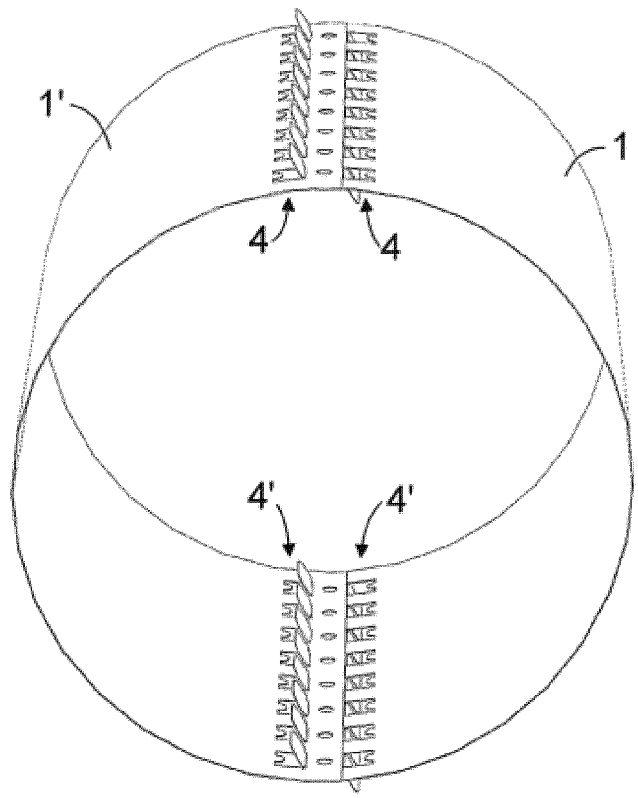
FIG. 18 discloses schematically a three-dimensional structure implemented with two flexible electronic foils.

According to an embodiment, the electronic foil 1 comprises a first joint area 4 at the edge 2c of the substrate 2 and a second joint area 4' at the edge of the substrate 2 being opposite to the edge 2c. The tabs 6 in a first joint area 4 of the electronic foil 1 may then be inserted into the openings 7 in the second joint area 4' of the one and same electronic foil 1. Correspondingly the openings 7 in the first joint area 4 of the one and same electronic foil 1 may be arranged to receive the tabs 6 of the second joint area 4' of the one and same electronic foil 1. In this embodiment the first 4 and second 4' joint areas of the single electronic foil 1 are thus arranged to become joined or fastened to each other, whereby the single electronic foil 1 itself may provide a three-dimensional structure. In the embodiment like this the number of the joint areas may also be more than two, whereby different kind of three-dimensional structures may be provided by a single electronic foil. FIG. 17 discloses schematically an embodiment like that made of a single flexible electronic foil 1. FIG. 18, in turn, discloses schematically another three-dimensional structure but implemented with two flexible electronic foils 1', 1". In practice three-dimensional structures comprising any number of the electronic foils 1 may be provided.

In all of the embodiments disclosed in FIGS. 1-5 the fastening means 5 of the electronic foil 1, 1', 1" comprises both the tabs 6 and the openings 7 compatible to the tabs 6. According to an embodiment the fastening means 5 may comprise only either tabs 6 or openings 7, whereby it is assumed that the fastening means 5 in the counterpart object comprise other kind of but compatible fastening means.

As already shortly described above, the joining or fastening arrangement comprises a number of tabs 6 and a number of compatible openings 7. The joining or fastening is thereby arranged to take place by inserting the tabs 6 into the openings 7, whereby the tabs 6 snap into the openings 7 and a mechanical fastening is provided between the compatible tabs 6 and the openings 7. The tabs 6 and the openings 7 thus provide a mechanical fastening structure which, however, is openable by removing the tabs 6 away from the openings 7, whereby the two electronic foils or the electronic foil and some other object joined or fastened together may also become detached from each other without breaking them. The joint may be unmounted or reassembled for example for replacing broken foils.

The openings 7, as disclosed in Figures, may further comprise, at least at one edge thereof, at least one protruding part 9. The protruding part is an integral part of the substrate 2 and formed thereof. The protruding part 9 is intended to extend towards the area of the opening 7 and at the same time towards the other object which is intended to be joined to the electronic foil in question. When the tab 6 is inserted into the opening 7 provided with the protruding part 9, the protruding part 9 will remain above the tab 6 and the tab 6 becomes locked underneath the protruding part 9 and thereby prevents a possible unintentional detaching of the two objects joined together. In the embodiment disclosed the protruding part 9 is arranged at the edge 7" of the opening 7 remaining on the side of the central part of the electronic foil 1, 1', 1".

As said also already above, the electronic foil 1 comprises a number of electrically conductive conductors 3 arranged to the substrate 2, i.e. at least one electrically conductive conductor 3 but typically a numerous number of the electrically conductive conductors 3. According to an embodiment of the electronic foil 1 at least one electrically conductive conductor 3 is arranged to extend in the joint area 4 up to the edge 2c of the substrate 2 of the electronic foil 1 at a position remaining between the adjacent tabs 6. An example of that kind of electronic foil 1 is disclosed schematically in FIGS. 1, 2 and 3 wherein some of the conductors 3 are arranged to extend into the joint area 4 up to the edge 2c of the substrate 2 of the electronic foil 1 at positions remaining between at least some of the adjacent tabs 6.

In the joining or fastening arrangement comprising two electronic foils 1', 1", as disclosed for example in FIG. 3, the second electronic foil 1" has been turned upside down and laid on top of the first electronic foil 1' so that the joint area region 4 in the second electronic foil 1" at least partly overlaps the joint area 4 in the first electronic foil 1'. Due to the upside down position of the second electronic foil 1" the electrically conductive conductors 3 in the second electronic foil 1" are presented with broken lines. The tabs 6 in the first electronic foil 1' has been inserted into the openings 7 in the second electronic foil 1" and the tabs 6 in the second electronic foil 1" has been inserted into the openings 7 in the first electronic foil 1". In this position of the first 1' and the second 1" electronic foils the conductors 3 in the second electronic foil 1" are laid on top of the conductors 3 in the first electronic foil 1', whereby there is provided an electrical connection between the connectors 3 in the first 1' and the second 1" electronic foils. The tabs 6 and the openings 7 of the first 1' and the second 1" electronic foils join or attach the first 1' and the second 1" electronic foils mechanically to each other and also align the first 1' and the second 1" electronic foils as well as the conductors 3 therein relative to each other. The joint areas 4 of the electronic foils 1', 1" thus provide both the mechanical connection and the electrical connection between the electronic foils 1', 1" as well as the aligning of the electronic foils 1', 1" relative to each other.

Figure 8:
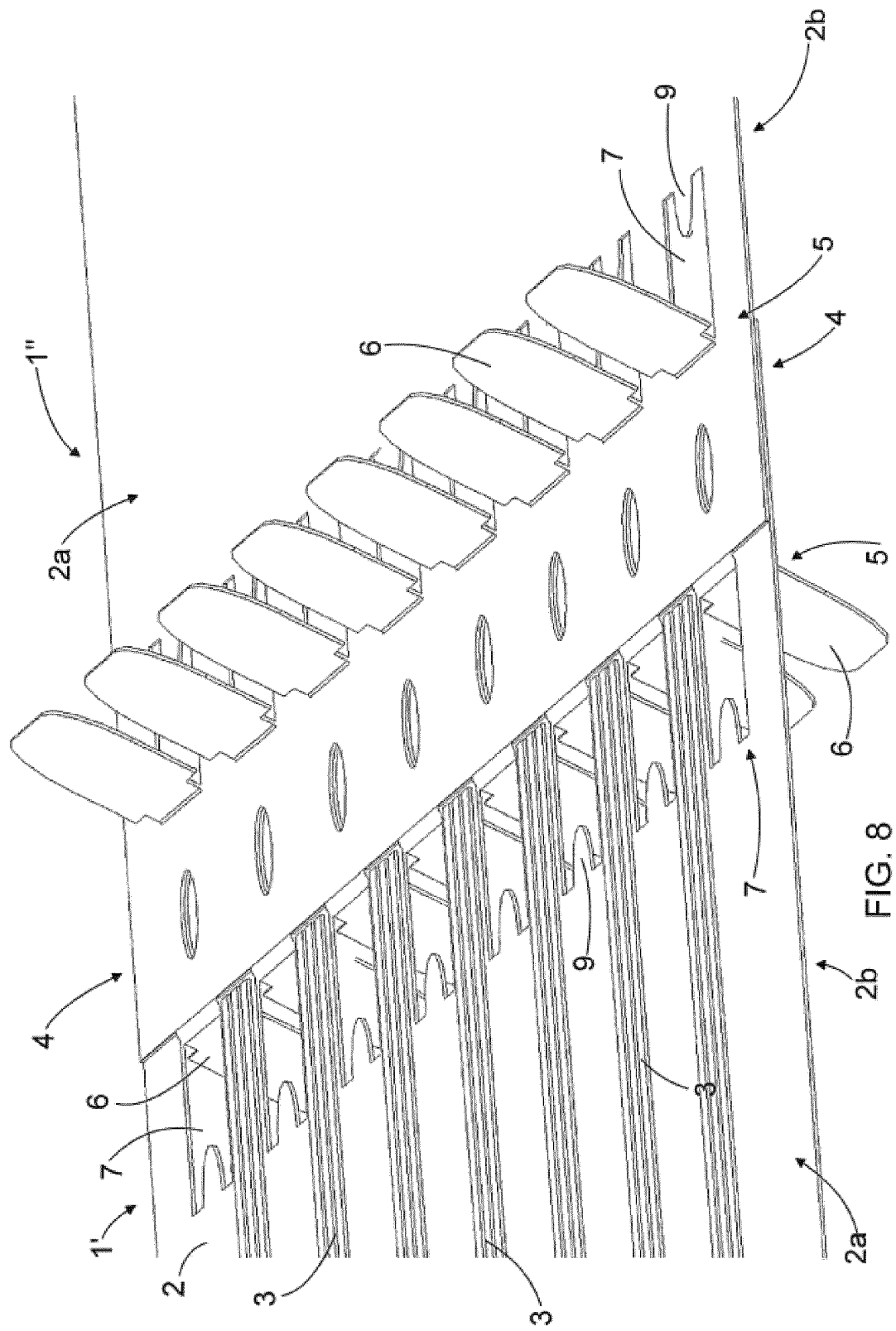
FIG. 8 shows schematically an intermediate phase in the joining of two electronic foils together.

FIG. 8 discloses schematically an intermediate phase of joining the electronic foils 1', 1" together, at which intermediate phase the tabs 6 of the electronic foils 1', 1" have been inserted through the respective openings 7 but not yet turned underside of the protruding parts 9 in the openings 7.

In the joining arrangement of the electronic foil 1', 1" in FIG. 3 the connectors 3 in the first electronic foil 1' are on an upper surface of the foil arrangement, whereas the connectors 3 in the second electronic foil 1" are on a lower surface of the foil arrangement. By alternating the positioning of the connectors 3 in the joining arrangement of the foils in the way disclosed it may be provided a foil arrangement layout resembling checker board pattern what comes to the positioning of the conductors 3 in the joining arrangement of the foils.

Figure 6:
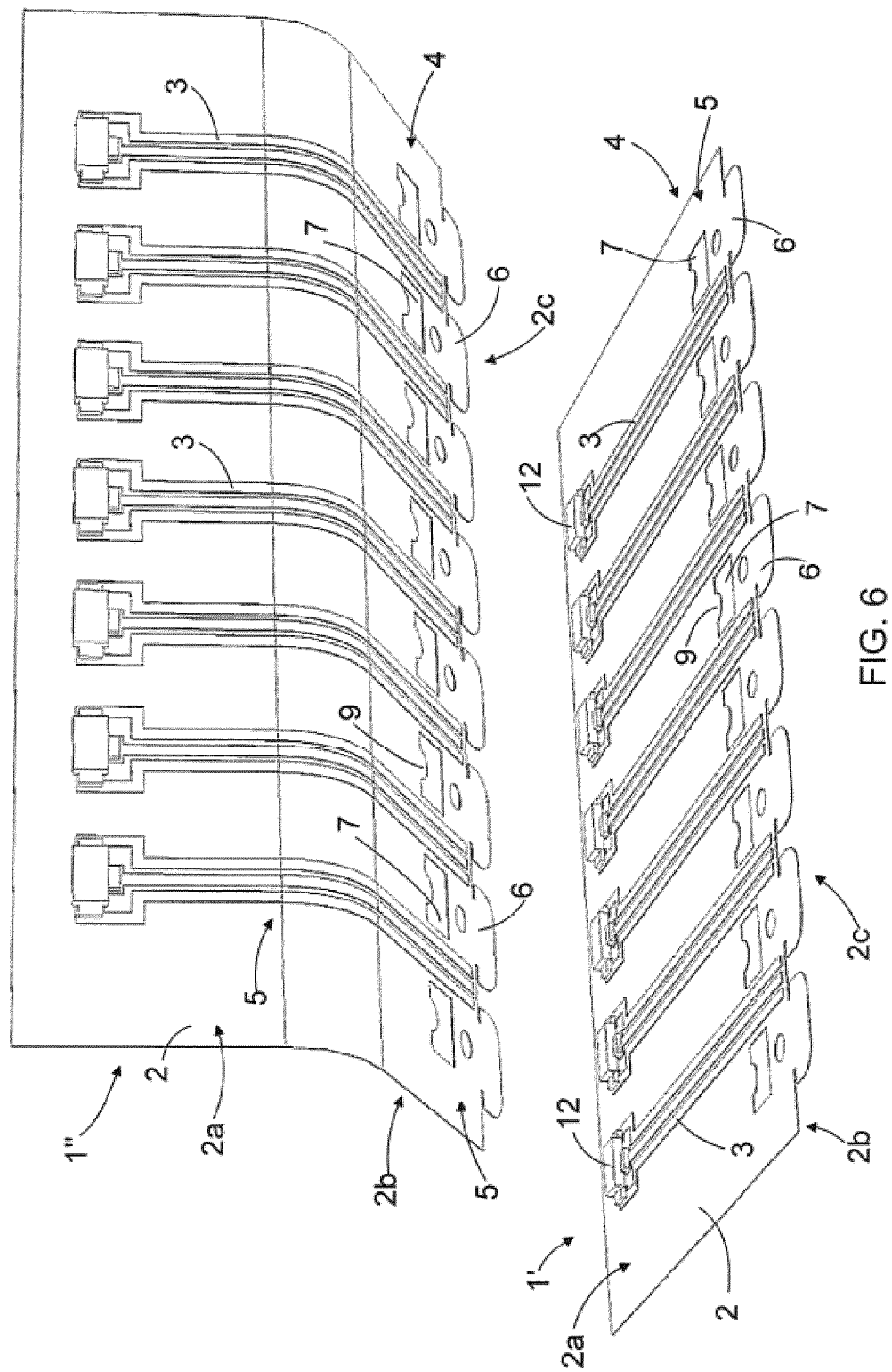
FIGS. 6 and 7 show schematically an alternative embodiment of an electronic foil.
Figure 7:
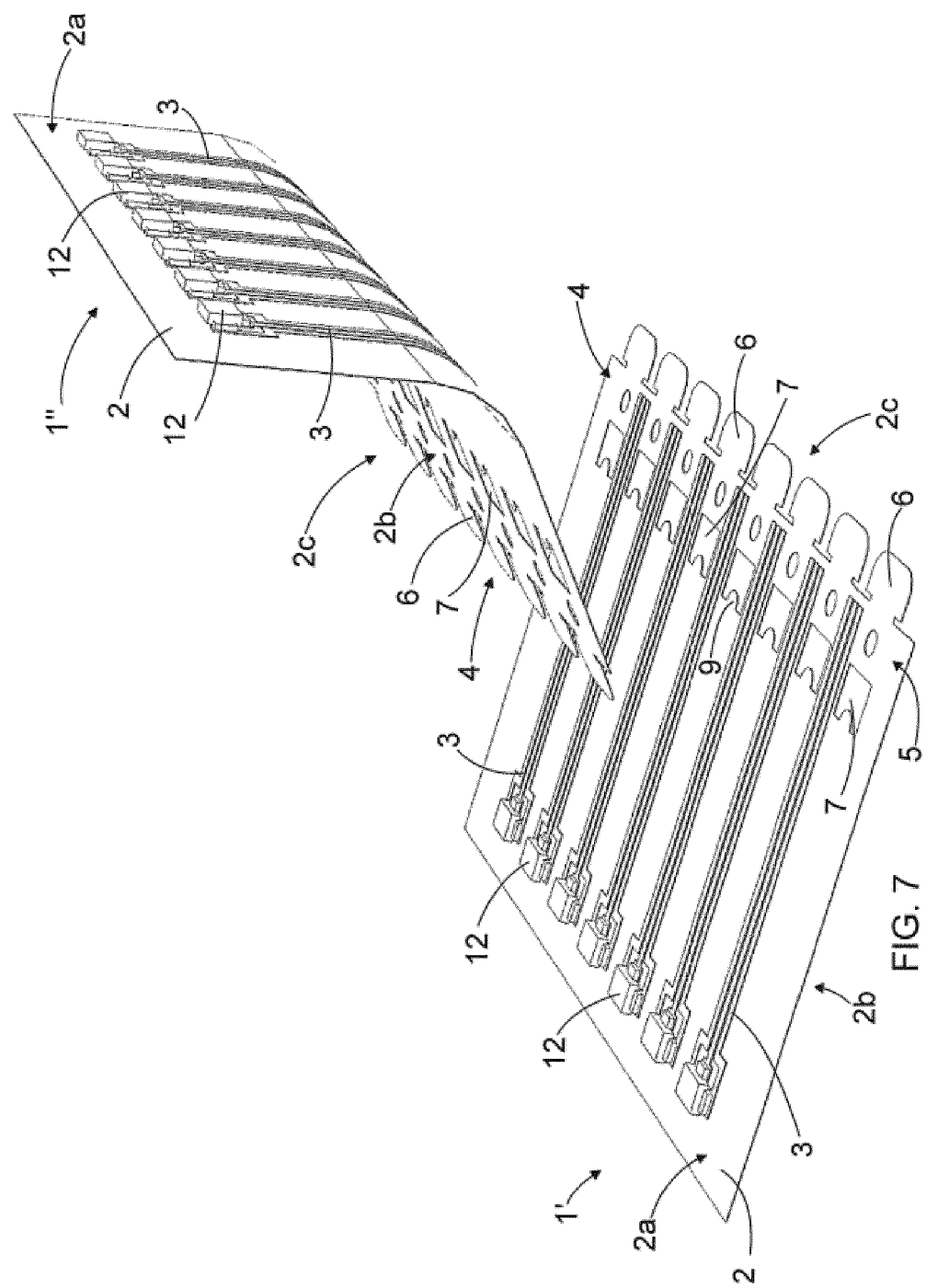

According to an embodiment of an electronic foil 1 at least one electrically conductive conductor 3 is arranged to extend into the joint area 4 in such a way that at least one conductor 3 is arranged to extend up to a position remaining between the tabs 6 and the openings 7 but not extending up to the tabs 6. An example of the electronic foil 1 like that is disclosed schematically in FIGS. 6 and 7. In the joining or the fastening arrangement disclosed in FIGS. 6 and 7 the second electronic foil 1" has been turned upside down to be laid on top of the first electronic foil 1' so that the joint area 4 in the second electronic foil 1" at least partly overlaps the joint area 4 in the first electronic foil 1". The tabs 6 in the first electronic foil 1' are to be inserted into the openings 7 in the second electronic foil 1" and the tabs 6 in the second electronic foil 1" are to be inserted into the openings 7 in the first electronic foil 1", whereby the electronic foils 1', 1" are aligned relative to each other so that the conductors 3 in the second electronic foil 1" are to be laid on top of the conductors 3 in the first electronic foil 1', and whereby both the mechanical connection and the electrical connection between electronic foils 1', 1" is provided. FIGS. 6 and 7 disclose also schematically some electronic components 12 which may be assembled to the electronic foils at the electrically conductive portions.

According to an embodiment of an electronic foil 1 at least one electrically conductive conductor 3 may be arranged to extend into the joint area 4 up to a position remaining at least partly on top of at least one tab.

Figure 9:
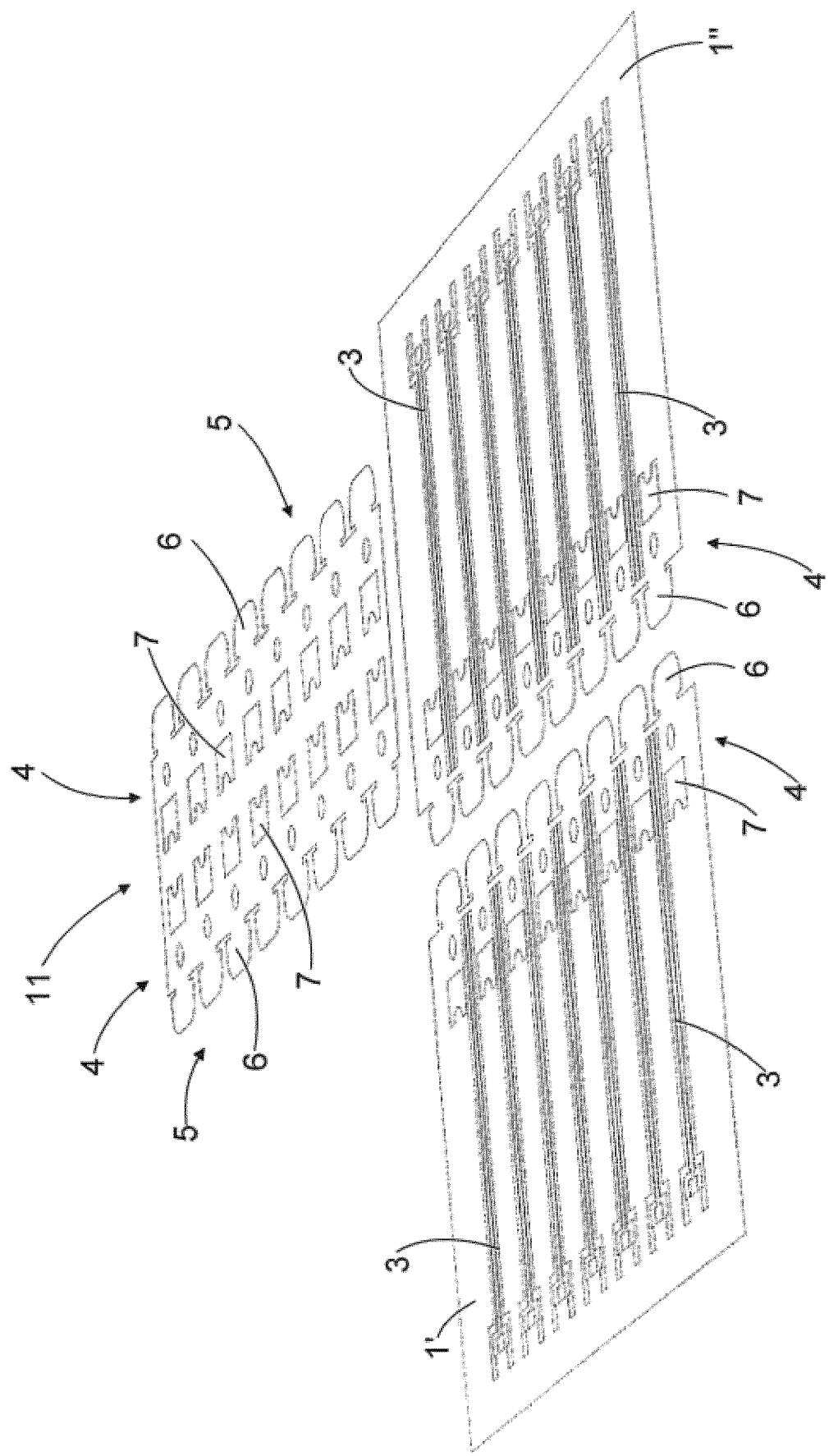
FIG. 9 discloses schematically a further embodiment of joining two electronic foils together.

FIG. 9 discloses schematically a further embodiment of joining or fastening two electronic foils 1', 1" to each other. The embodiment of FIG. 9 comprises a first 1' and a second 1" electronic foil similar to those of FIG. 2 and additionally a separate joining part 11 or a cross over joining part 11 intended for joining the electronic foils 1', 1" to each other. The joining part 11 comprises fastening means 5, i.e. the tabs 6 and openings 7 similar to those described above, at those edges of the joining part 11 that are intended to be joined to the first 1' and second 1" electronic foils. Additionally the joining part 11 comprises electrically conductive conductors 3 that are compatible to the electrically conductive conductors 3 of the first 1' and second 1" electronic foils intended to be connected to each other. For the sake of clarity, the electrically conductive conductors 3 are not shown in FIG. 9 but they are arranged on the lower side of the joining part 11 that is not visible in FIG. 9.

In the joining arrangement of FIG. 9 the first 1' and the second 1" electronic foils are laid next to each other without any intended overlap therebetween. The joining part 11 is laid over the first 1' and the second 1" electronic foils to at least partly overlap the joint areas 4 in the first 1' and the second 1" electronic foils. The tabs 6 in the joining part 11 are inserted into the respective openings 7 in the first 1' and the second 1" electronic foils, and the tabs 6 in the first 1' and the second 1" electronic foils are inserted into the respective openings 7 in the joining part 11, whereby the conductors 3 in the joining part 11 are to be laid on top of the conductors 3 in the first 1' and the second 1" electronic foils, and whereby both the mechanical connection and the electrical connection between electronic foils 1', 1" is provided by the joining part 11.

The joining arrangement and the joining part 11 disclosed in FIG. 9 may be used in connection with any kind of electronic foil as disclosed herein.

In the embodiments disclosed above the mechanical fastening means 5 are arranged close to the edge of the substrate of the electronic foil 1 but depending on the intended use of the electronic foil 1 the joint area 4 and the mechanical fastening means 5 therein may also be arranged at a central area of the electronic foil 1 as well. An example of this kind of joining or attachment arrangement is shown schematically in FIGS. 10a and 10b, wherein two electronic foils 1', 1" are arranged to provide a layered structure of the electronic foils wherein a larger first electronic foil 1' is intended to provide a lower electronic foil and a smaller second electronic foil 1" is intended to provide an upper electronic foil in the layered structure of the electronic foils. The larger first electronic foil 1' is provided with four joint areas 4, each joint area 4 having only openings 7. The smaller second electronic foil 1' is also provided with four joint areas 4, each joint area 4 having only tabs 6. When the layered structure of the electronic foils 1, 1" is assembled, the tabs 6 in the second electronic foil 1" are inserted into the openings 7 in the first electronic foil 1'.

The second electronic foil 1" to be laid on top of the first electronic foil 1' may for example comprise operational modules 13, such as a display, a photovoltaic cell, an energy reserve, or any combination of those or other components or functional assemblies. These may be for example optical/mechanical structures, such as lenses or actuators based on piezo, microelectromechanical systems (MEMS), or micromotors, piezo-electric or electrostatic speakers, antennas, microphones or microphone arrays. In the embodiment like that the second electronic foil 1" and the possible operation modules therein may simply be replaced by a new second electronic foil 1".

According to an embodiment the smaller second electronic foil 1" may also be arranged to partly overlap two larger first electronic foils 1" joined together.

Figure 10A:
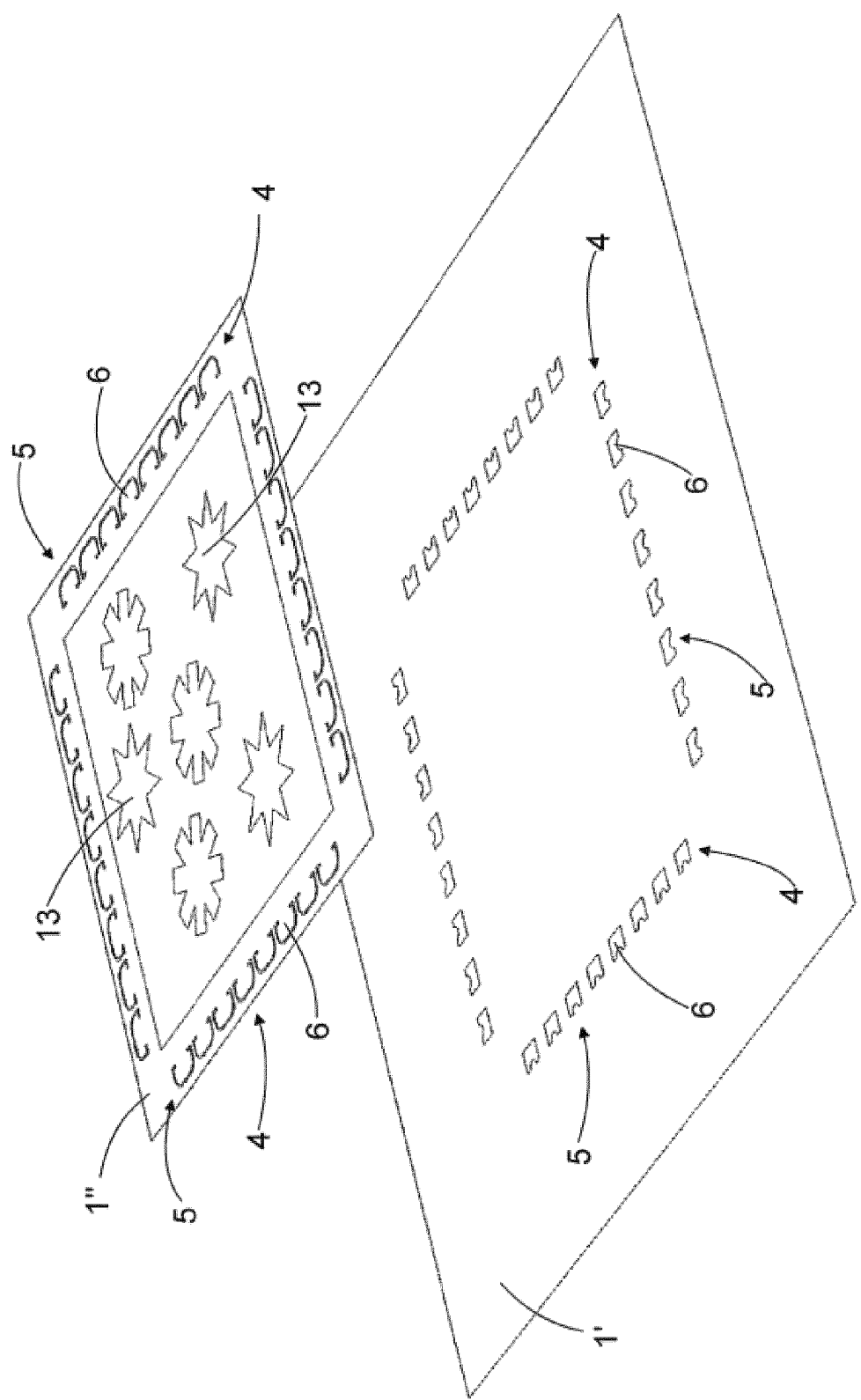
FIGS. 10a and 10b discloses schematically a further alternative embodiment of joining two electronic foils together.
Figure 10B:
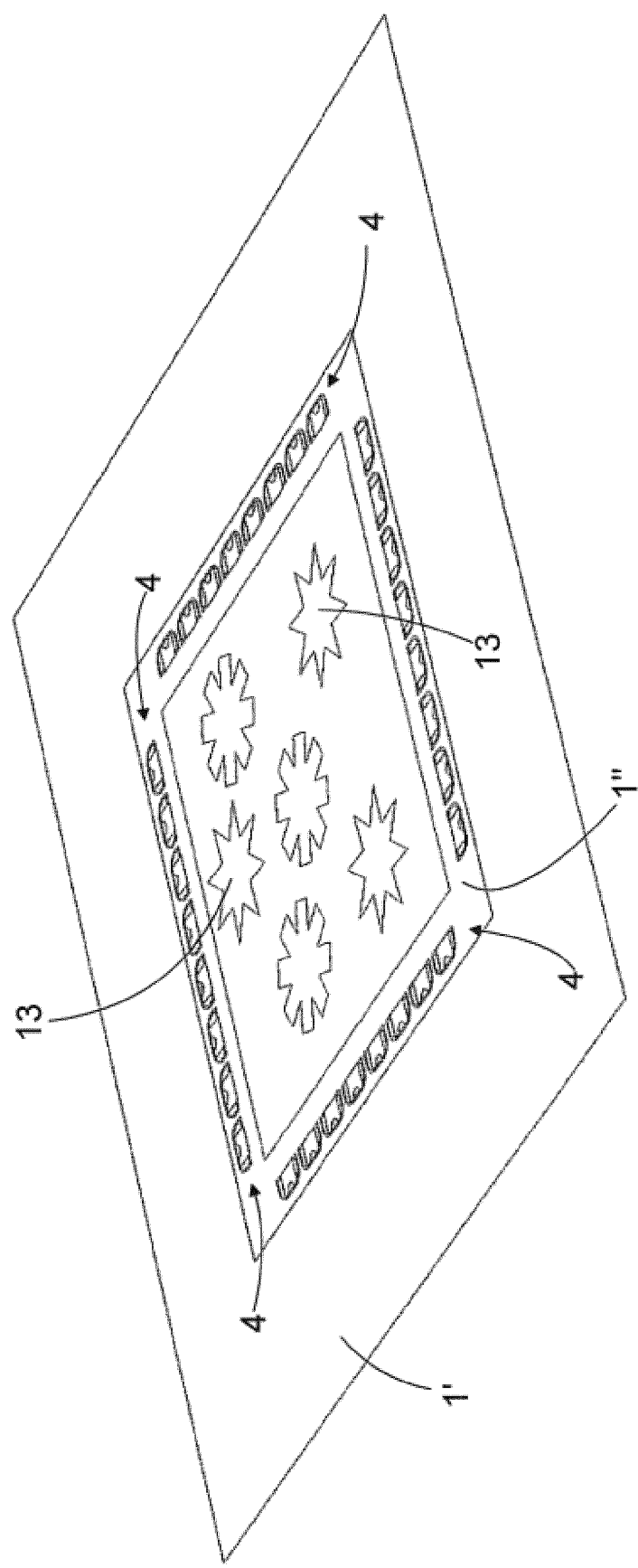

For the sake of clarity no electrically conductive conductors 3 are disclosed in FIGS. 10a and 10b.

In the embodiments disclosed in FIGS. 1 to 9 the tabs 6 and the openings 7 are arranged at different lines following a direction determined by the edge 2c of the substrate 2 of the electronic foil 1, 1', 1" so that the tabs 6 are positioned on one line and the openings 7 are positioned on another line such that the openings 7 are arranged on the side of the central part of the electronic foil 1, 1', 1" relative to the tabs 6. However, a variety of positioning of the tabs 6 and the openings 7 may exist, whereby at least some tabs 6 and/or at least some openings 7 may exist on different lines than the rest of the tabs 6 and/or the rest of the openings 7. Each foil 1, 1', 1" may also comprise several joint areas 4 at this different positions and orientations so as to be able become fastened with a number of counterpart foils or other objects having variable sizes and/or shapes, whereby an entity provided by all the foils and other objects fastened together may have different shapes and/or sides. The foil 1, 1', 1" may also comprise optional positions being able to receive different kind of expansion parts, such as expansion boards or inserts to be attached to the foil 1, 1', 1".

Some of the tabs 6 may also become positioned closer to the central part of the electronic foil 1 than some of the openings 7. This different positioning of the tabs 6 and openings 7 may be used to ensure that two electronic foils 1 can be joined or fastened to each other in one single position or alignment only. The lines along which the tabs 6 and the openings 7 are positioned are not necessarily straight lines but they may also be curved lines.

Furthermore, in the embodiments disclosed in FIGS. 1-9 the positioning of the openings 7 is the same as the positioning of the tabs 6 in the direction determined by the edge 2c of the electronic foil 1, 1', 1". However, the positioning of the tabs 6 and the openings 7 may also be different from that if the positioning of the mating tabs 6 and openings 7 in the counterpart for the electronic foil 1, 1', 1" is compatible to that different positioning. This different positioning of the tabs 6 and openings 7 may also be used to ensure that two electronic foils 1 or the electronic foil 1 and some other object can be joined or fastened to each other in one single position or alignment only. Instead of the different positioning of the tabs 6 and openings 7 adaptable sizes or variations of shapes of the tabs 6 and openings 7 may be utilized for that purpose.

Figure 11A:
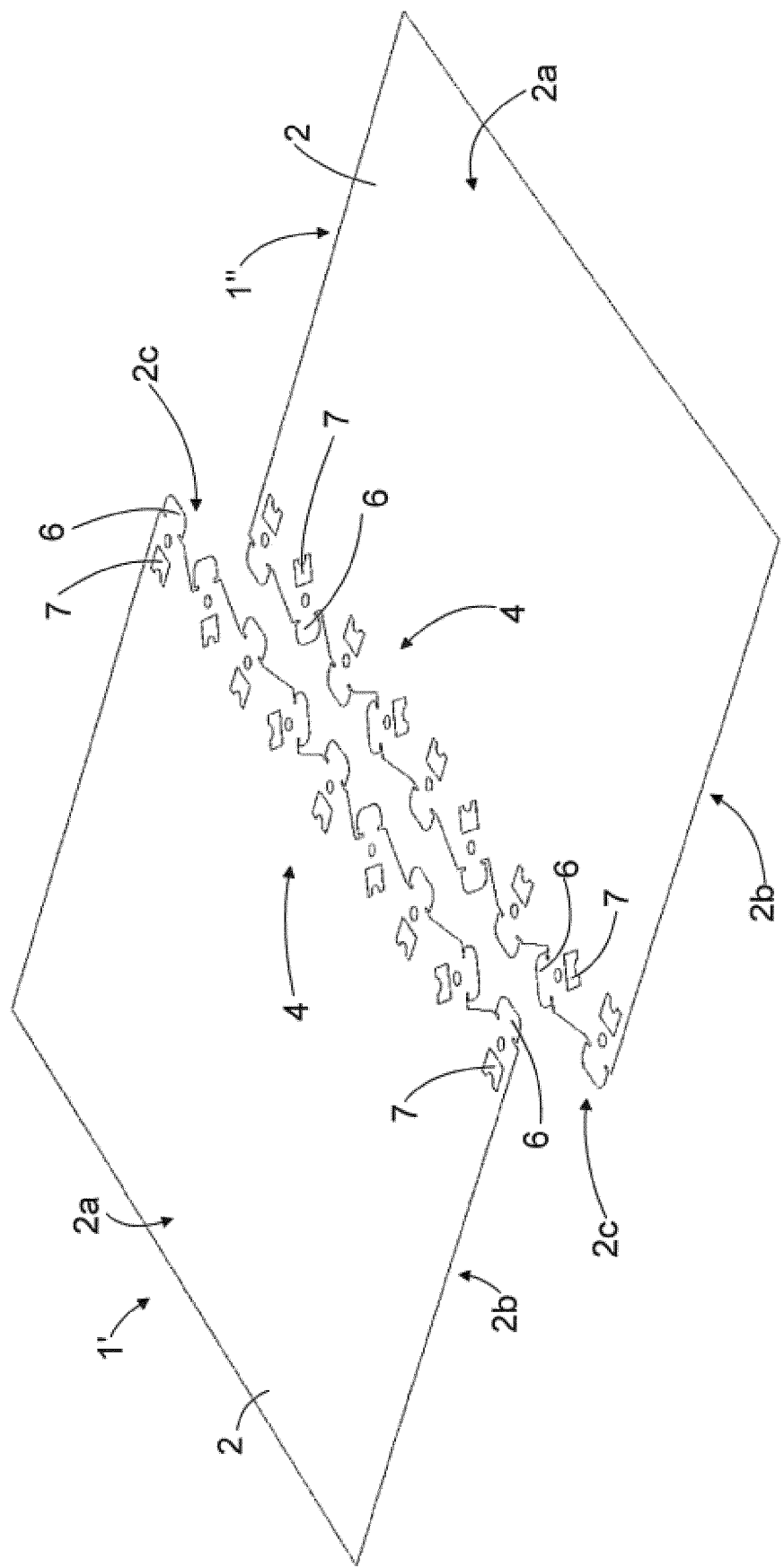
FIGS. 11a and 11b disclose schematically a further alternative embodiment of joining two electronic foils together.
Figure 11B:
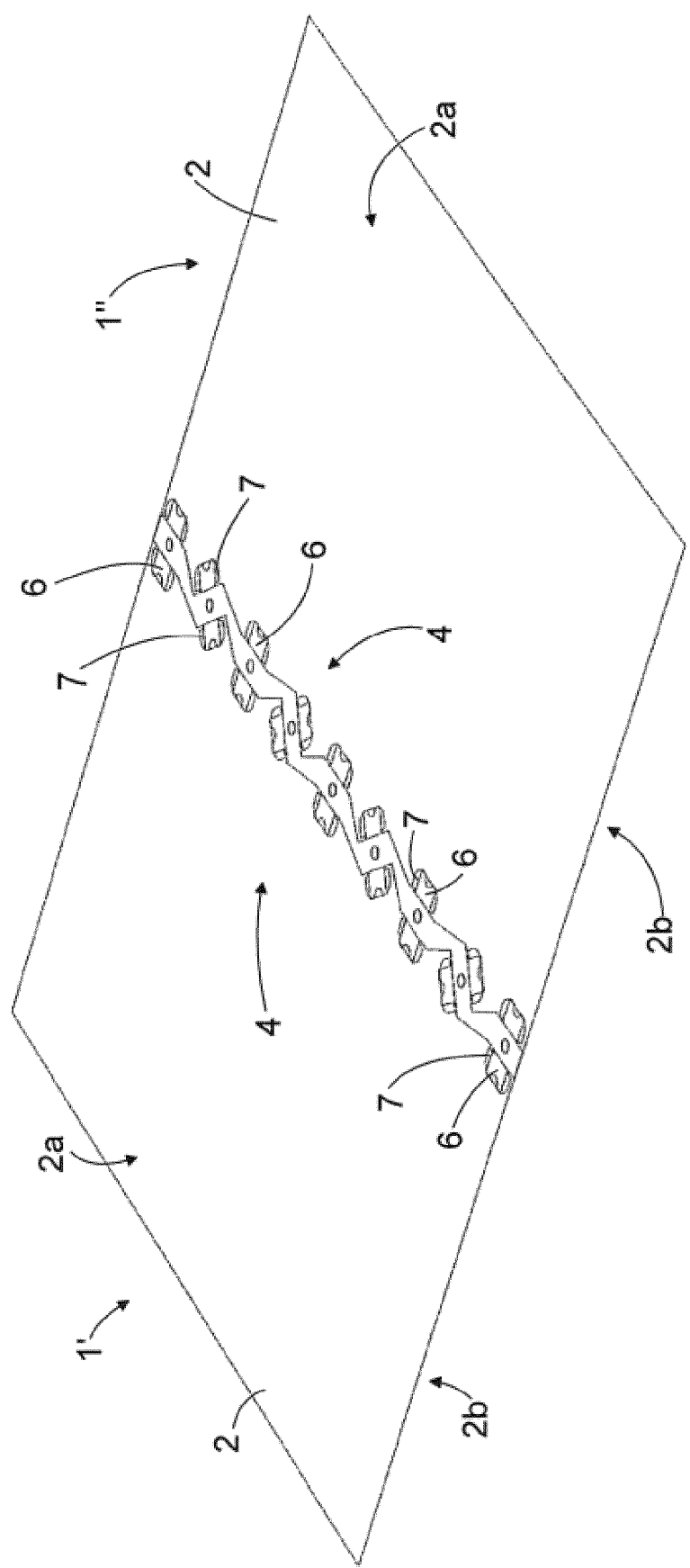

An example of that kind of joining or attachment arrangement is shown schematically in FIGS. 11a and 11b, wherein two electronic foils 1', 1" comprise both the tabs 6 and the openings 7 and wherein each pair of the fastening means consisting of a single tab 6 and a respective opposite single opening 7 are positioned into a different orientation relative to the neighbouring pair of the fastening means consisting of a single tab 6 and a respective opposite single opening 7. With this kind fastening means arrangement any clearances between the foils 1', 1" may be minimized. At the same time it is provided a support against the mutual movement of the electronic foils 1', 1" in all the direction thereof. For the sake of clarity no conductors 3 are disclosed in FIGS. 11a and 11b.

In the embodiments disclosed above the number of the tabs 6 and the number of the openings 7 are equal. The number of the tabs 6 and the number of the openings 7 may also be unequal if the number of the mating tabs 6 and openings 7 in a counterpart for the electronic foil 1, 1', 1" is compatible. This unequal number of the tabs 6 and openings 7 may also be used to ensure that two electronic foils 1 or the electronic foil 1 and some other object can be joined or fastened to each other in one single position or alignment only.

In all the embodiments disclosed above it is presented a joining or attachment arrangement for joining or attaching two electronic foils together. The same joining or attachment solutions may of course be applied when joining or attaching together the electronic foil and some other object that provides a counterpart for the electronic foil in question.

The joining solution described herein is cost efficient to manufacture because there is no need for any additional parts to provide the joint. The joining solution described not only join or fasten the two objects mechanically together but at the same time also aligns the objects and possible electrically conductive portions therein relative to each other.

The joining solution described is also reliable because it is self-supporting and strong. Any strains in the joint are also evenly distributed especially if the tabs and the openings are evenly distributed. The joining solution does not also limit the design or shaping of the foils, i.e. there is freedom of design of the foils and different kind of custom shapes, as three-dimensional shapes disclosed above, may be easily made.

FIGS. 12, 13, 14, 15 and 16 disclose schematically a side view of a variety of embodiments for providing or ensuring electrical connection between electrically conductive conductors in the foils attached together. For the sake of clarity the fastening means of the electronic foils 1', 1" are not disclosed in FIGS. 12-16. In FIGS. 12, 13, 14, 15 and 16 is it assumed that the upper electronic foil is the first electronic foil 1' and the lower electronic foil is the second electronic foil 1", the electronic foils 1', 1" partly overlapping each other.

Figure 12:
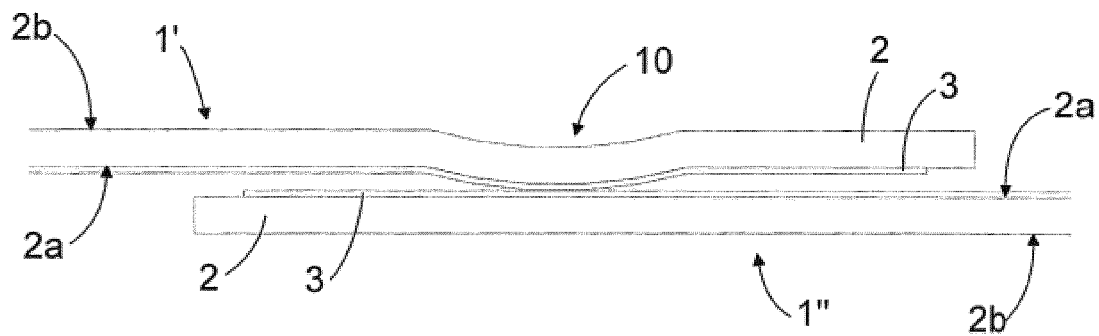
FIGS. 12, 13, 14, 15 and 16 disclose schematically a side view of a variety of embodiments for providing or ensuring electrical connection between electrically conductive conductors in the foils attached together.

In the embodiment of FIG. 12 the first electronic foil 1' is turned upside down so that the first surface 2a of the substrate 2 of the first electronic foil 1' is directed towards the first surface 2a of the substrate 2 of the second electronic foil 1', whereby the electronically conductive conductor 3 in the first electronic foil 1' faces towards the electronically conductive conductor 3 in the second electronic foil 1". Furthermore in the embodiment of FIG. 12 there is a bump 10 in the first electronic foil 1' at least at the position of the electrically conductive conductor 3. The bump 10 is arranged to extend towards the first surface 2a of the substrate 2 of the first electronic foil 1' comprising the electrically conductive conductors 3, whereby in the position of the first electronic foil 1' shown in FIG. 12 the bump 10 is arranged to extend towards the second electronic foil 1" and the electrically conductive conductor 3. The bump 10 produces a springback factor that forces the first electronic foil 1' and the electrically conductive conductor 3 therein against the second electronic foil 1" and the electrically conductive conductor 3 therein, thus ensuring that there is an electrical connection between the first 1' and the second 1" electronic foils. The bumps 12 may also be provided by membrane switches, which may also be utilized for example to provide manually implementable programming of the operation of the electronic foils.

Figure 13:
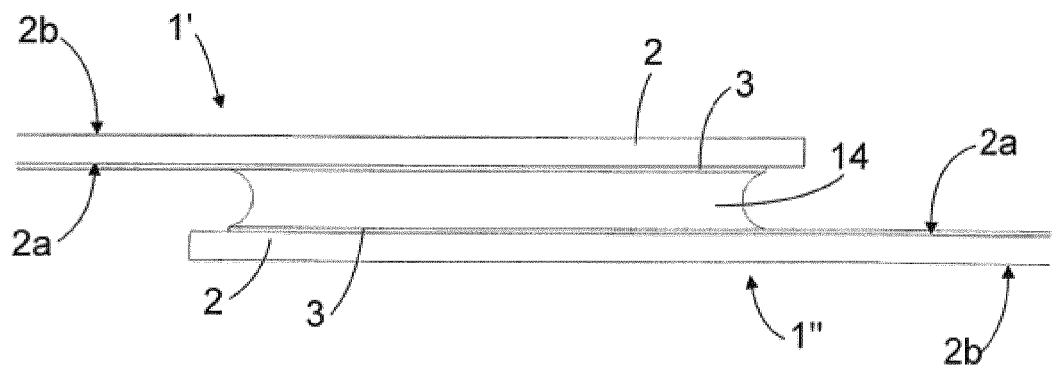

In the embodiment of FIG. 13 the first electronic foil 1' is turned upside down so that the first surface 2a of the substrate 2 of the first electronic foil 1' is directed towards the first surface 2a of the substrate 2 of the second electronic foil 1', whereby the electronically conductive conductor 3 in the first electronic foil 1' faces towards the electronically conductive conductor 3 in the second electronic foil 1". Furthermore in the embodiment of FIG. 12 there is a layer 14 of electrically conductive material, such as aluminium or copper, between the electrically conductive conductors 3 in the first 1' and the second 1" electronic foils. The layer 14 of electrically conductive material 3 attach the electrically conductive conductor 3 in the first electronic foil 1' to the electrically conductive conductor 3 in the second electronic foil 1", thus ensuring that there is an electrical connection between the first 1' and the second 1" electronic foils.

Figure 14:
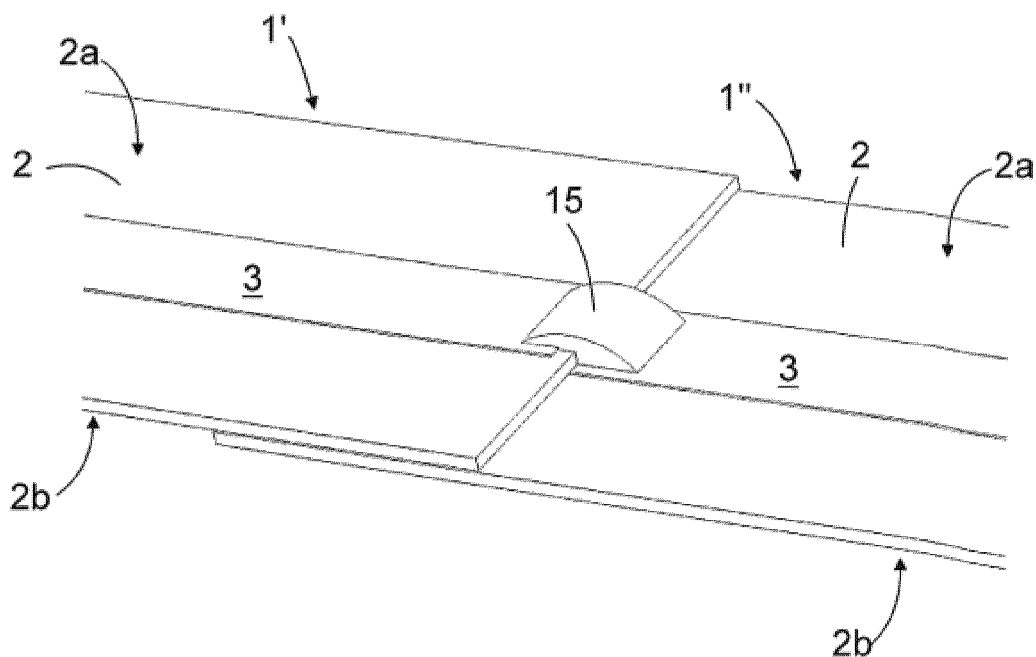
Figure 15:
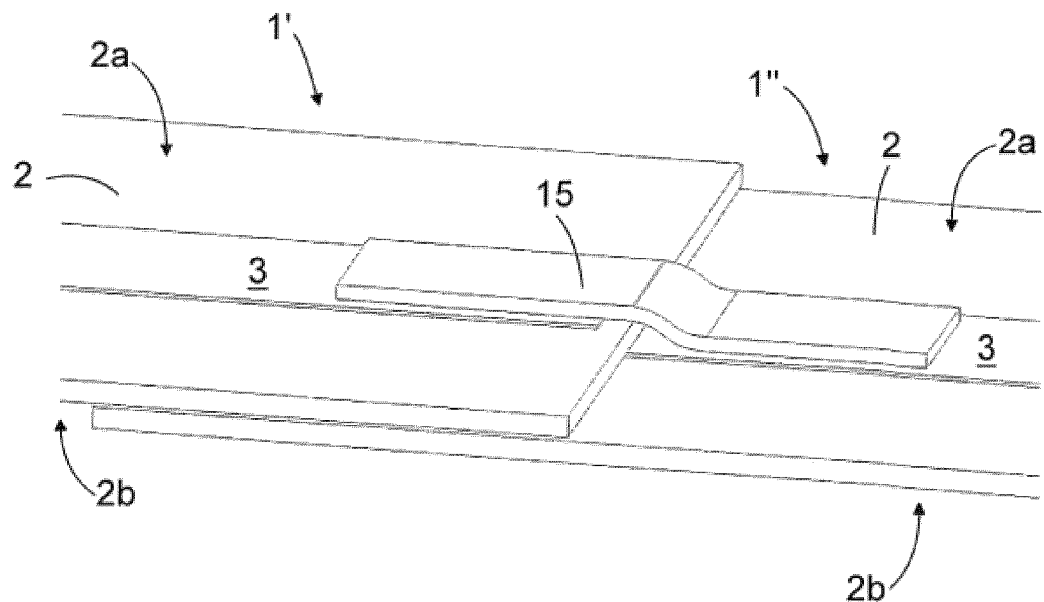

In the embodiments of FIGS. 14 and 15 the first sides 2a of the substrates 2 of the first 1' and the second 1" electronic foils and the electrically conductive conductors 3 therein are facing towards the same direction and the first electronic foil 1' is arranged to partly overlap the second electronic foil 1". Furthermore in the embodiments of FIGS. 14 and 15 there is an electrically conductive bridge 15 extending from the first side 2a of the substrate 2 of the first electronic foil 1' to the first side 2a of the substrate 2 of the second electronic foil 1" at the position comprising the electrically conductive conductors 3 in the first 1' and the second 1" electronic foils, thus providing the electrical connection between the first 1' and the second 1" electronic foils.

Figure 16:
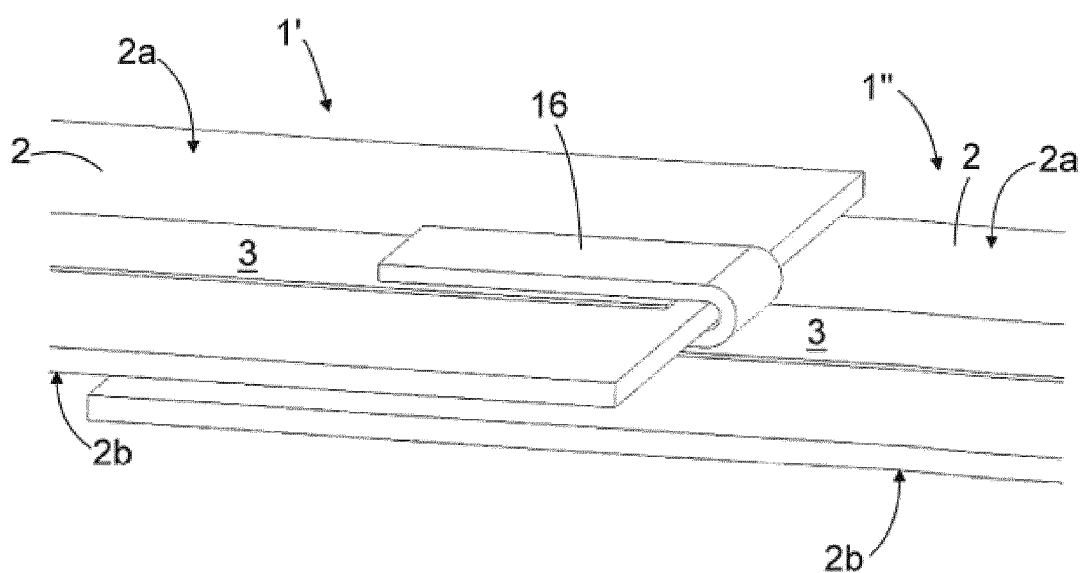

In the embodiment of FIG. 16 the first sides 2a of the substrates 2 of the first 1' and the second 1" electronic foils and the electrically conductive conductors 3 therein are also facing towards the same direction and the first electronic foil 1' is arranged to partly overlap the second electronic foil 1". Furthermore in the embodiment of FIG. 16 there is an electrically conductive bridge 16 extending from the first side 2a of the substrate 2 of the first electronic foil 1' up to the second side 2b of the substrate 2 of the first electronic foil 1' over the edge of the first electronic foil 1' at the position comprising the electrically conductive conductors 3 in the first 1' and the second 1" electronic foils. On the second side 2b of the substrate 2 of the first electronic foil 1' the electrically conductive bridge 16 is laid against the electrically conductive conductor 3 of the second electronic foil 1", thus providing the electrical connection between the first 1' and the second 1" electronic foils.

In the embodiment of FIGS. 13, 14, 15 and 16 the layer 14 of the electrically conductive material or the electrically conductive bridges 15, 16 may be of electrically conductive solder or electrically conductive adhesive material, whereby the layer 14 of the electrically conductive material or the electrically conductive bridges 15, 16 do not only ensure or provide the electrical connection between the opposite foils 1', 1" but may also strengthen the mechanical connection between the foils 1', 1". The electrically conductive adhesive may be anisotropic adhesive material providing the electrical conductivity only in one direction, i.e. vertically from the conductors 3 in one foil to respective conductors 3 in the other foil but not horizontally between different conductors 3 in the same foil so as not to provide any short circuit between a number of individual parallel conductors possibly forming the electrically conductive conductors 3. The anisotropic adhesive material may be ready for instant use or it may be heat or thermally activated. The anisotropic adhesive material may for example be tape or glue.

Figure 28:
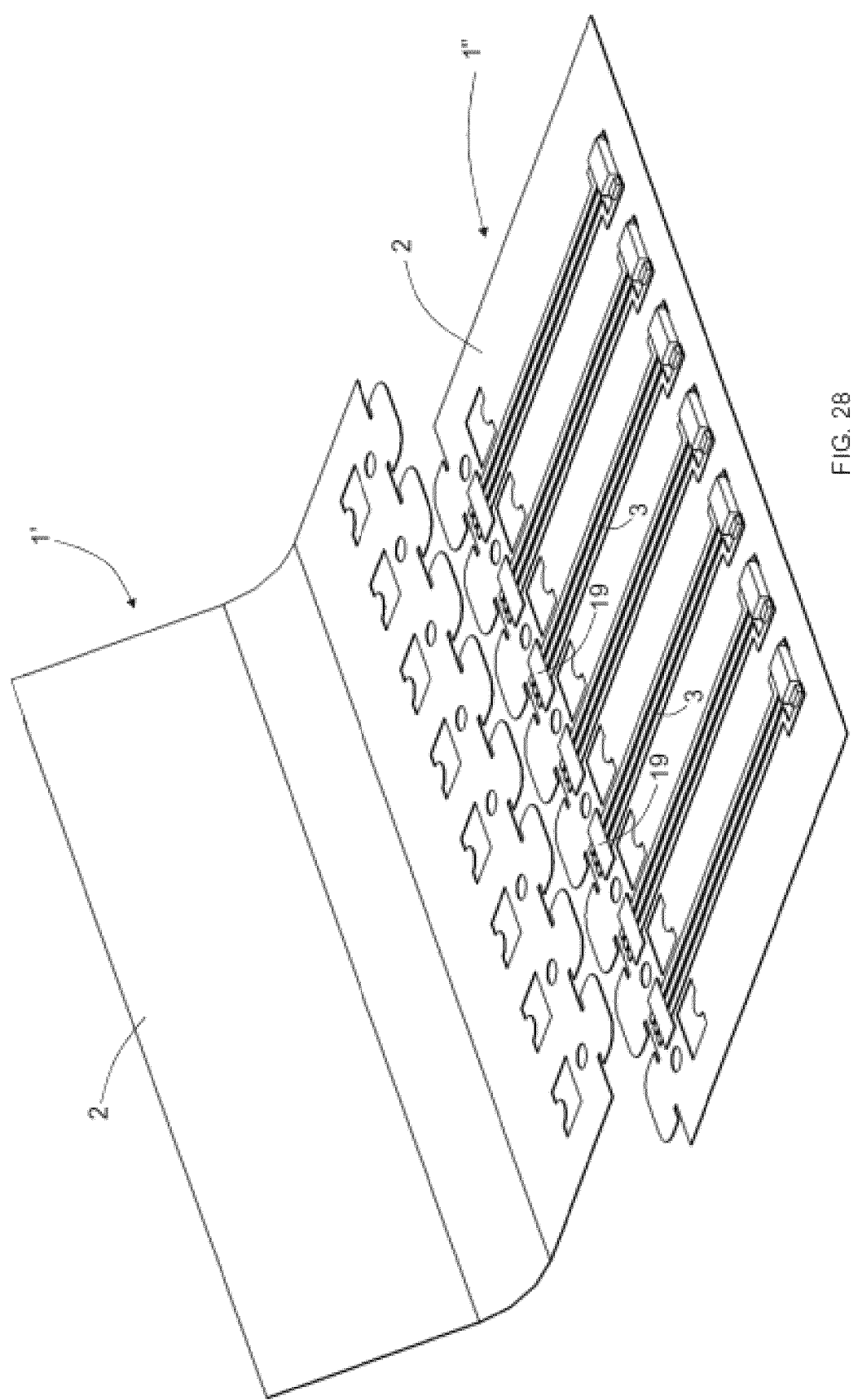
FIG. 28 discloses schematically a further embodiment for providing or ensuring electrical connection between electrically conductive conductors in the foils attached together.

FIG. 28 further discloses an embodiment wherein an electrically conductive tapes 19 are arranged between the opposite foils 1', 1" at the positions of the electrically conductive conductors 3 at the opposite foils 1', 1" so as to ensure the electrical connection between the electrically conductive conductors 3 of the opposite foils 1', 1" but also to strengthen the mechanical connection between the foils 1', 1" at the positions of the oppositely positioned conductors 3. Preferably the tapes 19 are of anisotropic adhesive material providing the electrical conductivity only in one direction i.e. vertically from the conductors 3 in one foil to respective conductors 3 in the other foil but not horizontally between different conductors 3 in the same foil so as not to provide any short circuit between a number of individual parallel conductors possibly forming the electrically conductive conductors 3. Instead of the anisotropic tape 19 anisotropic glue may be applied between the electrically conductive conductors 3 to be positioned opposite to each other.

The joint or fastening of the foils may be provided by hands or with a tool designed for that purpose. For the joint to be implemented by the tool there may be pivot points 17 arranged at the fastening means 5 of the electronic foils 1, 1', 1", for example between the tabs 6 and the openings 7 as schematically disclosed for example in FIGS. 4 and 5, for controlling the operation of the tool. When all the pivot points 17 in the neighbouring foils to be fastened together are congruent, the neighbouring foils to be fastened together are in positions where they can be fastened together by the fastening means of the foils. A tool, which may be the same tool or a different tool, may also be used to detach the foils fastened together.

Figure 19:
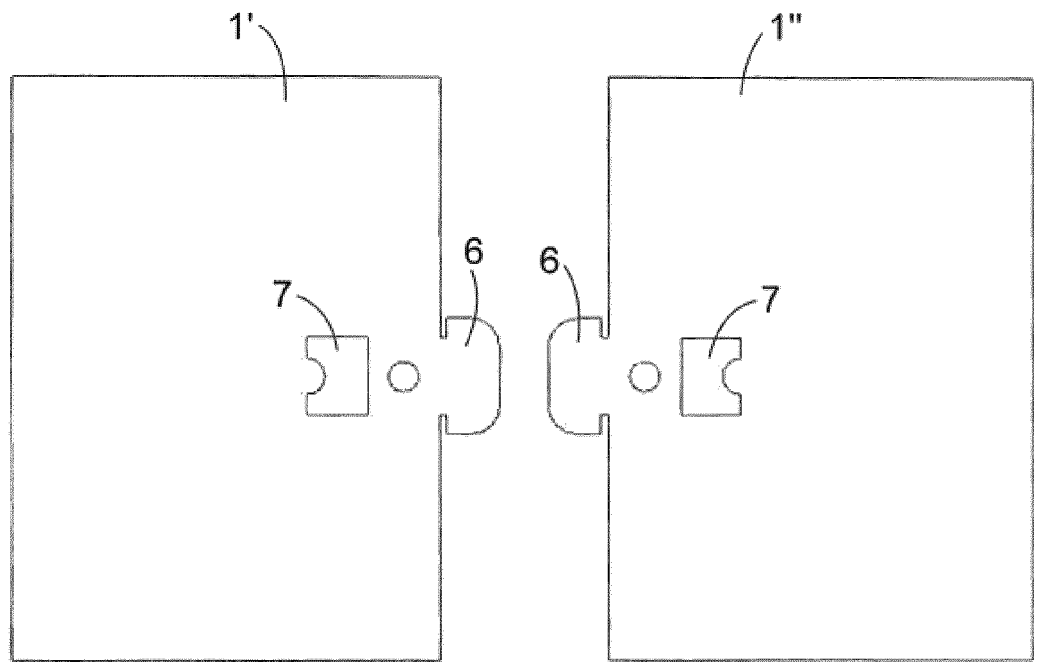
FIG. 19 discloses schematically a further alternative embodiment of joining two electronic foils together.

FIG. 19 discloses schematically a further alternative embodiment of joining two electronic foils 1', "together. In the embodiment of FIG. 19 the first electronic foil 1' comprises only one tab 6 and only one opening 7. Correspondingly the second electronic foil 1" comprises only one tab 6 and only one opening 7, which are compatible with the tab 6 and the opening 7 in the first electronic foil 1'. When the foils 1', 1" are fastened together, the tab 6 in the first electronic foil 1' is inserted into the opening 7 in the second electronic foil 1", the opening 7 in the second electronic foil 1" thus providing a counterpart for the tab 6 in the first electronic foil 1', and similarly the tab 6 in the second electronic foil 1" is inserted into the opening 7 in the first electronic foil 1', the opening 7 in the first electronic foil 1' thus providing a counterpart for the tab 6 in the second electronic foil 1".

Figure 20:
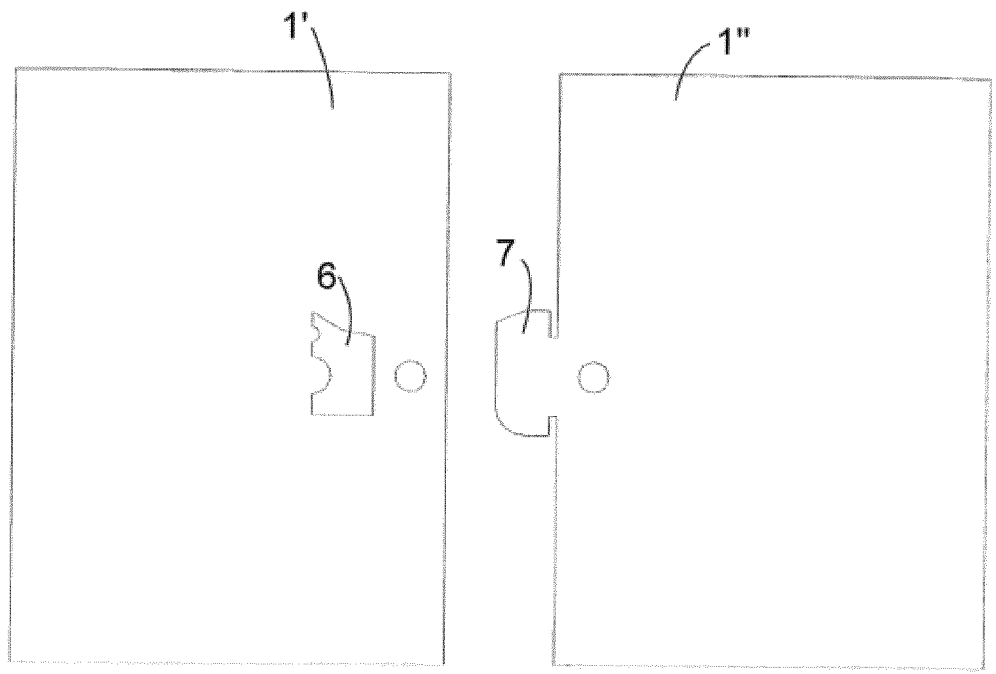
FIG. 20 discloses schematically a further alternative embodiment of joining two electronic foils together.

FIG. 20 discloses schematically a further alternative embodiment of joining two electronic foils together. In the embodiment of FIG. 20 the first electronic foil 1' comprises only one opening 7 but not a single tab 6. Correspondingly the second electronic foil 1" comprises only one tab 6 but not a single opening 7. Furthermore, in the embodiment of FIG. 20 the shape of the tab 6 and the shape of the opening 7 are unsymmetrical, whereas in the other embodiments disclosed the shape of the tab 6 and the shape of the opening 7 are symmetrical.

Figure 21:
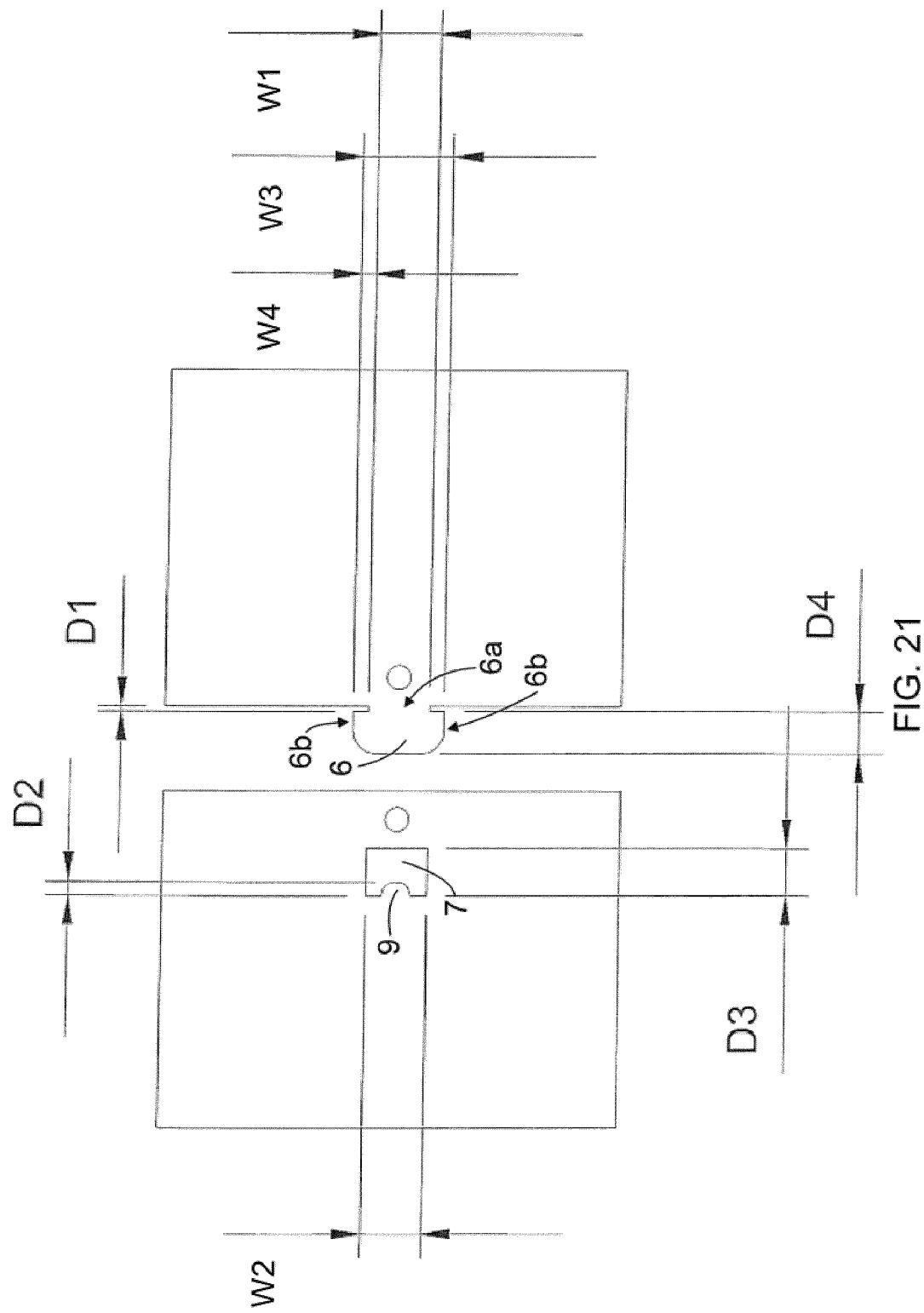
FIG. 21 discloses schematically one possible design principle of fastening means.

FIG. 21 discloses schematically one possible design principle of the tab 6 and the opening 7 providing the counterpart for the tab 6. The width W2 of the opening 7 is substantially the same as the width W1 of a neck portion 6a of the tab 6. The neck portion 6a of the tab 6 joins the tab 6 to the other portion of the substrate 2. The total width W3 of the tab 6 including the portion of the tab 6 at the neck portion 6a as well as overhangs 6b of the tab 6 relative to the neck portion 6a of the tab 6 is, in turn, at least somewhat larger than the width W2 of the opening 7, whereby the tab 6 may become locked with at least one edge of the opening 7. The width W4 of the overhang 6b of the tab 6, i.e. (W3-W1)/2, is larger than the thickness of the foil 1, 1', 1", whereby the overhangs 6b are not able to slip unintentionally from the edges of the opening 7 in the counterpart foil. The length D1 of the neck portion 6a of the tab 6 is substantially the same as the thickness of the counterparting foil 1, 1', 1" whereby it is able to achieve as small clearance as possible between the foils to be fastened together. The length D4 of the portion of the tab 6 intended to extend through the counterparting opening 7 is substantially the same as the length D3 of the opening 7, whereby the clearance between the tab 6 and the counterparting opening 7 is close to zero. The length D2 of the protruding part 9, i.e. the extension D2 of the protruding part 9 from the edge 7" of the opening 7 is at least somewhat larger than the thickness of the foil 1', the extension 9 preventing the tab 6 inserted into the opening 7 to slip off from the opening 7 unintentionally.

Figure 22:
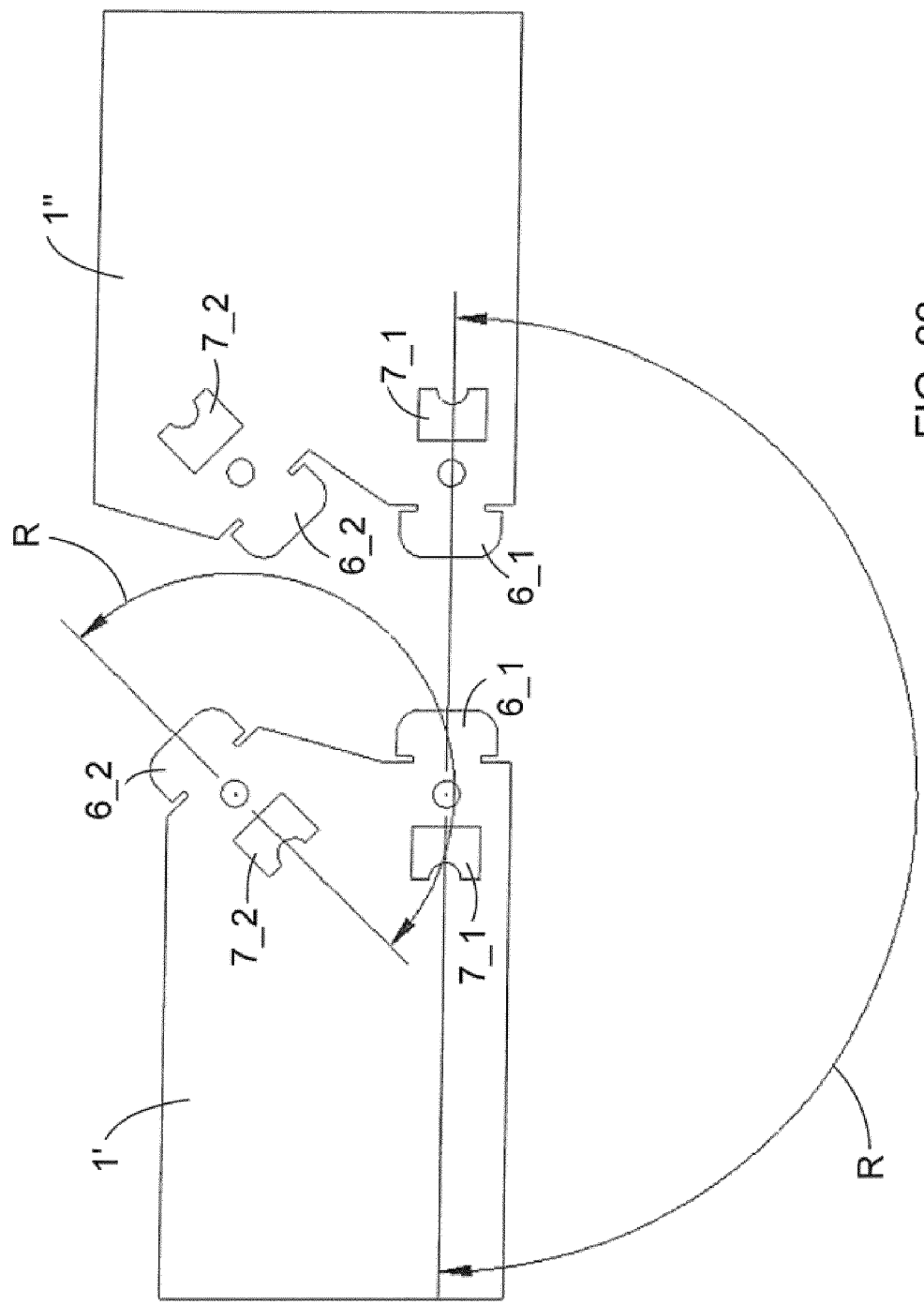
FIG. 22 discloses schematically another design principle of the fastening means.

FIG. 22 discloses schematically another design principle relating to the tabs 6 and the openings 7. FIG. 22 discloses a first electronic foil 1' and a second electronic foil 1". The first electronic foil 1' comprises a first tab 6_1 and a first opening 7_1 which provide a first pair of the fastening means in the first electronic foil 1'. The first electronic foil 1' comprises further a second tab 6_2 and a second opening 7_2 which provide a second pair of the fastening means in the first electronic foil 1'. The second electronic foil 1" comprises a first tab 6_1 and a first opening 7_1 which provide a first pair of the fastening means in the second electronic foil 1". The second electronic foil 1" comprises further a second tab 6_2 and a second opening 7_2 which provide a second pair of the fastening means in the first electronic foil 1'. The first pair of the fastening means in the second electronic foil 1" provide a counterpart for the first pair of the fastening means in the first electronic foil 1" and the second pair of the fastening means in the second electronic foil 1" provide a counterpart for the second pair of the fastening means in the first electronic foil 1". The first and second pairs of the fastening means in the second electronic foil 1" are arranged in the second electronic foil 1" at a position or alignment that corresponds to a rotation angle R of 180 degrees relative to the position or alignment of the first and second pairs of the fastening means in the first electronic foil 1". The counterpart fastening means in the foils 1', 1" to be fastened together are thus positioned or aligned at a specific rotation angle relative to each other, i.e. the first pair of the fastening means in the second electronic foil 1" are positioned at a specific turning angle relative to the counterpart first pair of the fastening means in the first electronic foil 1', and similarly the second pair of the fastening means in the second electronic foil 1" are positioned at the same specific turning angle relative to the counterpart second pair of the fastening means in the first electronic foil 1', whereby the counterpart pairs of the fastening means in the foils 1', 1" to be attached together will align to each other.

In the embodiment disclosed in FIG. 22 the specific rotation angle R is 180 degrees but it may also have some other value. The rotation angle R thus determines a design principle which the alignment of counterpart fastening means should fulfil so that two objects providing the counterparts to each other can be aligned and fastened to each other.

Figure 23:
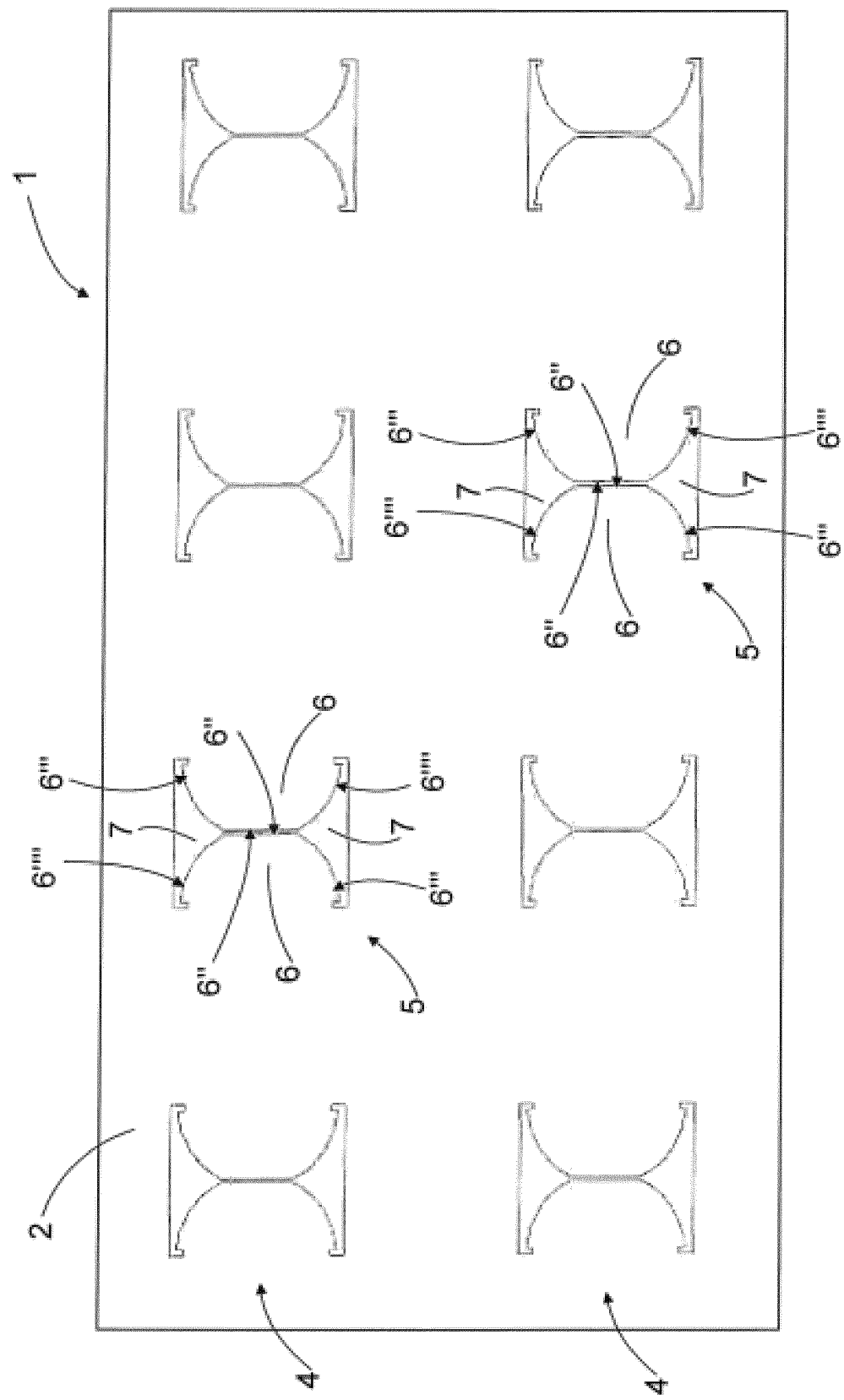
FIG. 23 shows schematically a further alternative embodiment of an electronic foil.
Figure 24:
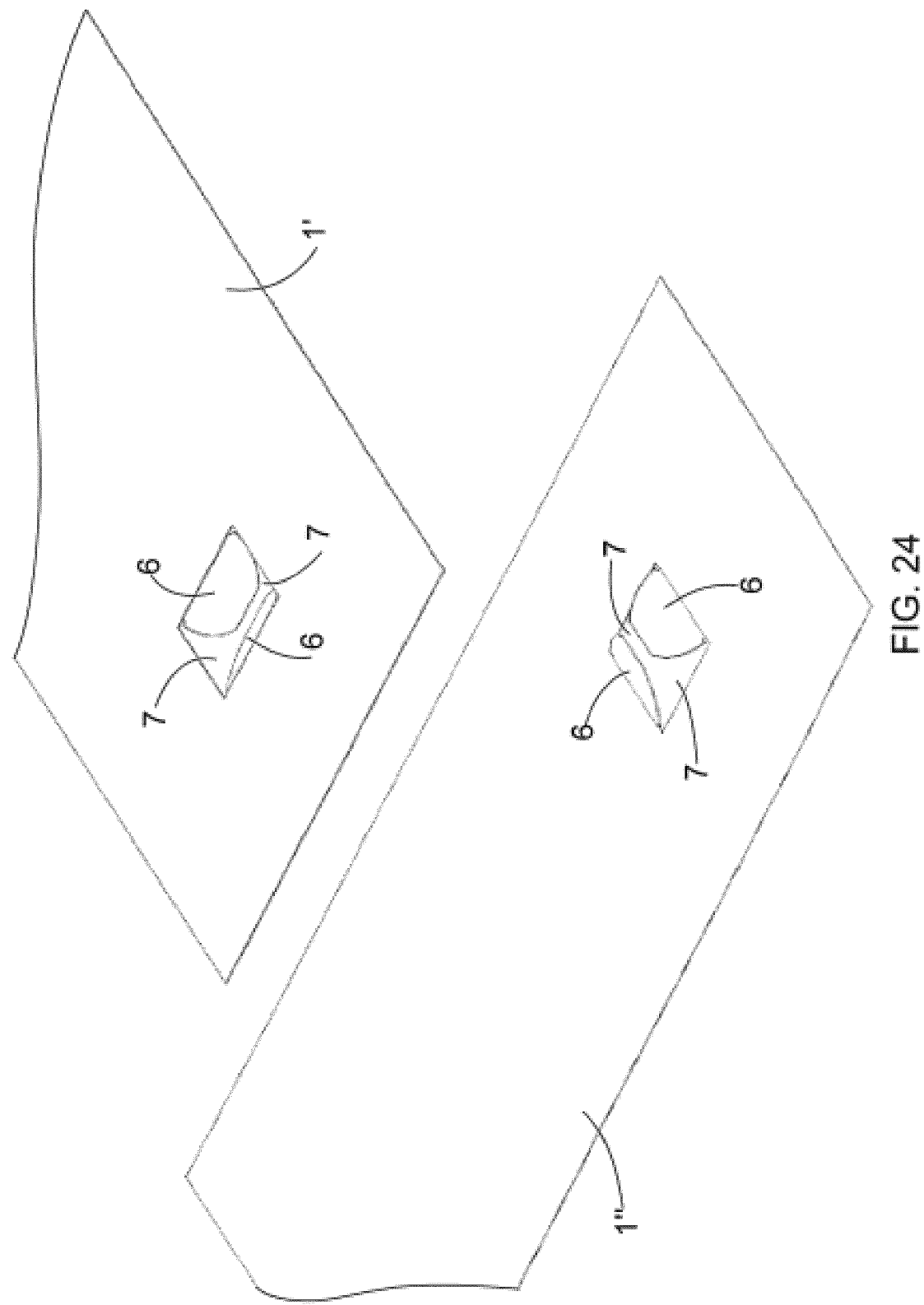
FIGS. 24 and 25 show schematically two electronic foils substantially similar to that of FIG. 23.
Figure 25:
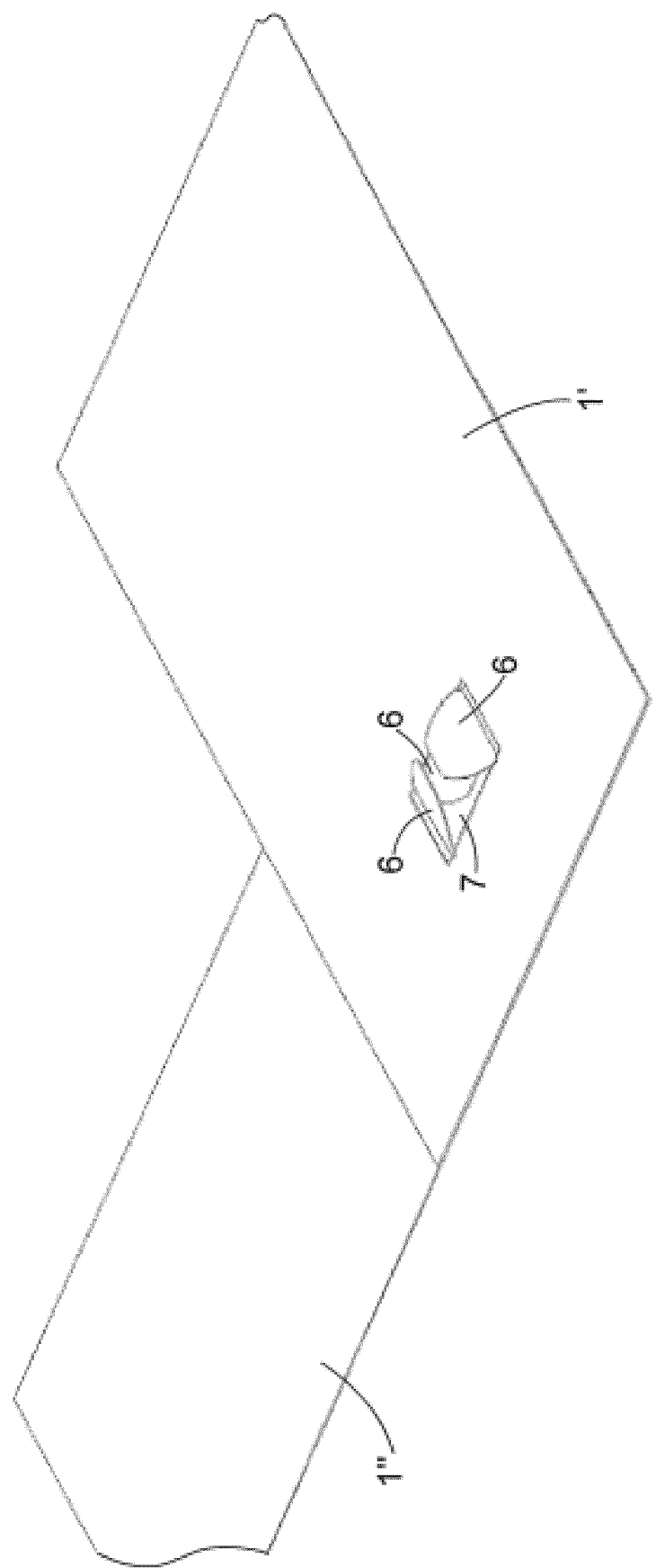

FIG. 23 shows schematically a further alternative embodiment of an electronic foil 1 and FIGS. 24 and 25 show schematically two electronic foils 1', 1" substantially similar to that of FIG. 23 joined mechanically to each other.

The electronic foil 1, 1', 1" comprises two joint areas 4 comprising a number of fastening means 5. Each fastening means 5 comprises two tabs 6 extending towards each other in such a way that free end edges 6" of the tabs 6 are arranged to face each other. The tabs 6 are cut off the substrate 2 such that next to side edges 6''', 6''' of the tabs 6 there are free spaces 7 that provide openings 7 which are arranged to receive compatible tabs of an object which is intended to be fastened with the foil 1, 1', 1".

FIG. 24 discloses a first electronic foil 1' and a second electronic foil 1" before fastening them together and FIG. 25 discloses the first electronic foil 1' and the second electronic foil 1" as fastened together, the foils 1', 1" comprising fastening means 5 as disclosed in FIG. 23. In FIG. 25 the tabs 6 of the second electronic foil 1" are inserted through the openings 7 in the first electronic foil 1'. The fastening between the first electronic foil 1' and the second electronic foil 1" takes place by corner edges 20 in the tabs 6 and respective corner edges 21 in the openings 7, the corner edges 20, 21 providing the counterparts locking to each other.

Figure 26:
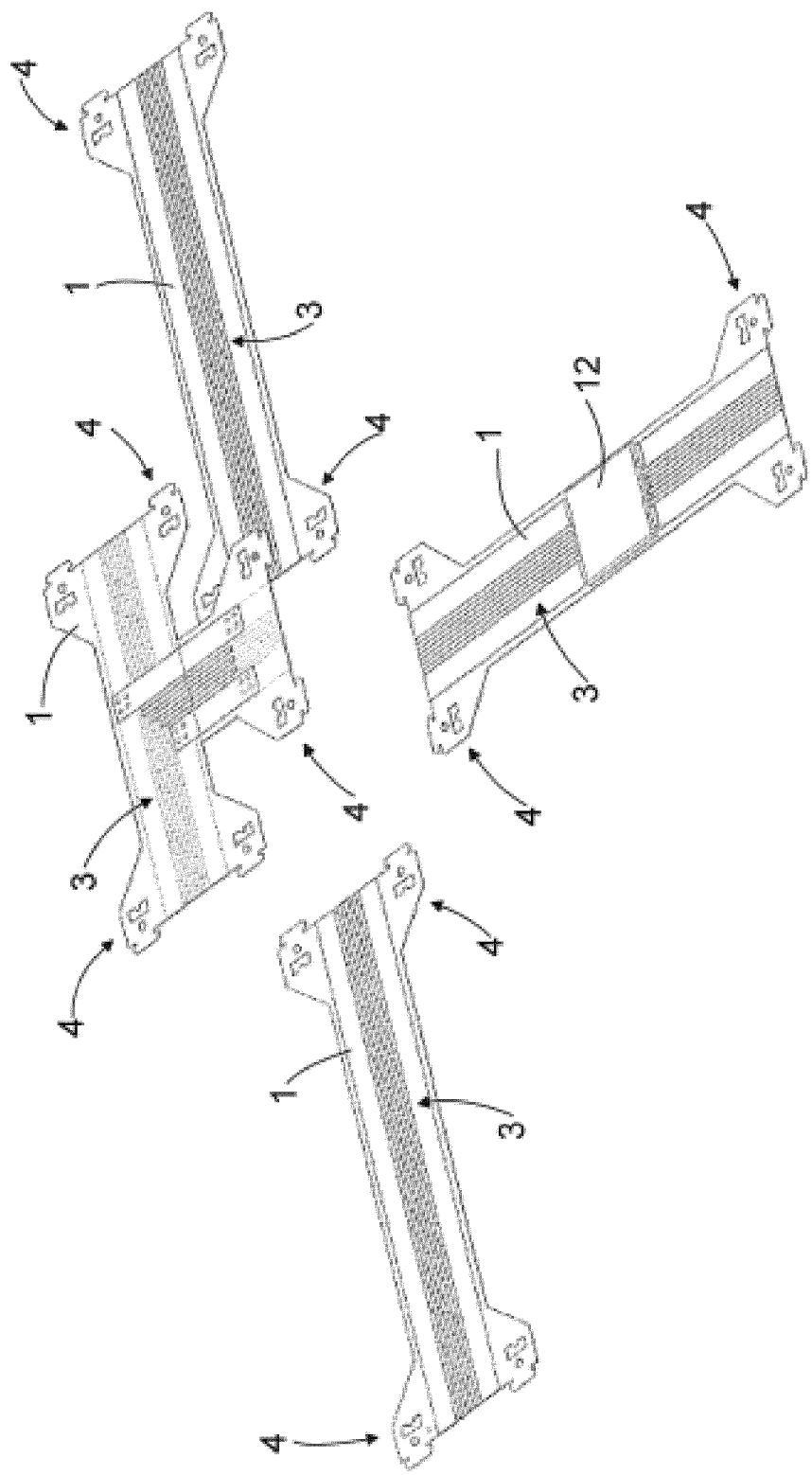
FIG. 26 disclose schematically a number of electronic foils to be attached together for providing an electric harness as disclosed schematically in FIG. 27.
Figure 27:
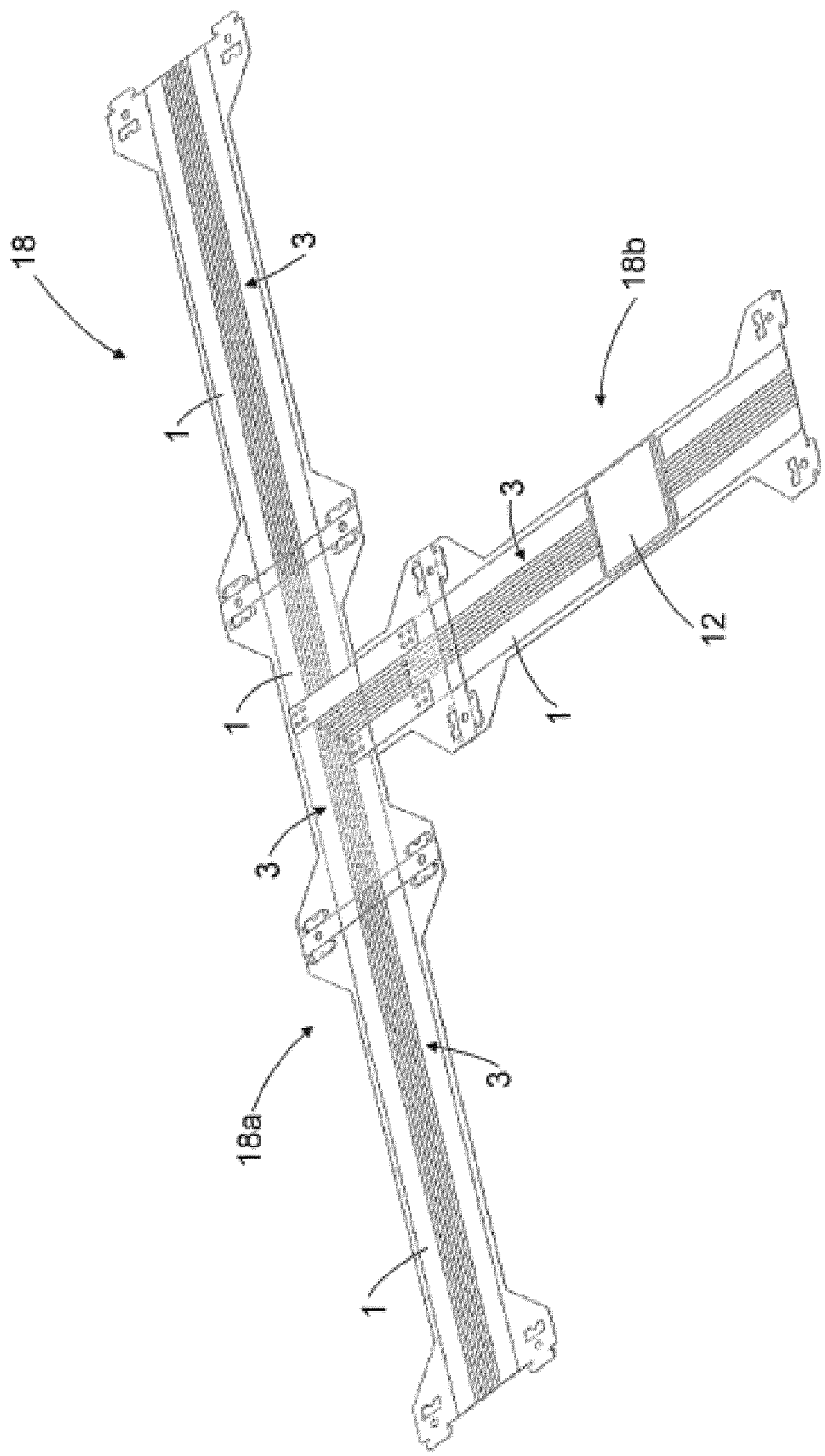

FIG. 26 disclose schematically a number of electronic foils 1 each comprising a number of electrically conductive conductor 3. In the embodiment shown schematically in FIG. 27 the electronic foils 1 of FIG. 26 are fastened together so as to provide an electric harness 18 which in FIG. 27 comprise a single main line 18a and a single branch line 18b. It is also possible to install on the electronic foil 1 forming at least part of the electric harness 18 a number of additional electronic components 12 that may for example provide a controller for an actuator or for a communication in a bus provided by the electrically conductive conductors 3.

The foils 1 providing the electric harness 18 may be embedded in other structures or materials. The foils 1 providing the electric harness 18 may also be arranged to form a self-supporting three-dimensional structure which may be installed inside an equipment box, for instance.

The fastening solution described herein enables also making very large area flexible electronics solutions cost effectively.

The electronic foil described herein may have numerous amount of different applications.

The electronic foil disclosed may be used for example in different kind of electrical or electronic devices, for example for installing electronic components to the electrical or electronic devices or for providing electrically conductive areas or portions in the electrical or electronic devices.

The electronic foil disclosed may also be used for example in different kind of mechanical devices or products or building industry products for example for installing electronic components or for providing electrically conductive portions in these devices or products.

The electronic foil may be an electronic foil intended to be fastened to a surface of the product or device or the electronic foil may be an electronic foil intended to be embedded into the product or device.

The electronic foil may also be used for providing three-dimensional self-supporting products, such as lamps or antennas and loudspeakers.

The electronic foil may also be used for providing planar or three-dimensional self-supporting products for producing visual effects.

It will be obvious to a person skilled in the art that, as the technology advances, the inventive concept can be implemented in various ways. The invention and its embodiments are not limited to the examples described above but may vary within the scope of the claims.

In the embodiments disclosed above the joint area in the electronic foil is intended to provide both the mechanical connection as well as the electrical connection to the object intended to provide the counterpart for the electronic foil. There may be, however, embodiments wherein there is no need for the electrical connection or the electrical connection may be provided with some other way, such as by using jumpers.

The invention claimed is:

1. A flexible electronic foil comprising a flexible substrate and at least one electrically conductive portion provided to the substrate, the foil comprising mechanical fastening means for mechanical fastening of the electronic foil, wherein the mechanical fastening means are part of the substrate of the electronic foil and comprise at least one tab and/or at least one opening provided through the substrate, wherein the at least one tab and/or the at least one opening comprising edges by which the mechanical fastening takes place, and wherein electrically conductive adhesive material is arranged on the electrically conductive portion for ensuring electrical connection between the electrically conductive portions in the same foil or between the electrically conductive portions in the foil and in an object providing the counterpart for the electronic foil.

2. An electronic foil as claimed in claim 1, wherein the electronic foil comprises at least one joint area comprising the mechanical fastening means as well as at least one electrically conductive portion for electrically connecting the foil.

3. An electronic foil as claimed in claim 2, wherein the electronic foil comprises at least two joint areas wherein the mechanical fastening means in at least one joint area in the foil are arranged to be compatible with the mechanical fastening means in at least one other joint area in the same foil for being able to receive the mechanical fastening means in at least one other joint area.

4. An electronic foil as claimed in claim 3, wherein orientation of at least one fastening means in the joint area is different from orientation of at least one other fastening means in the joint area.

5. An electronic foil as claimed in claim 2, wherein orientation of at least one fastening means in the joint area is different from orientation of at least one other fastening means in the joint area.

6. An electronic foil as claimed in claim 1, wherein the fastening means are integral parts of the substrate and formed therefrom.

7. An electronic foil as claimed in claim 1, wherein the fastening means are formed from the substrate by cutting the substrate material.

8. An electronic foil as claimed in claim 1, wherein the fastening means comprise at least one tab and at least one opening provided through the substrate, the opening being compatible with the tab.

9. An electronic foil as claimed in claim 1, wherein the at least one electrically conductive portion arranged to the substrate is an electrically conductive conductor arranged to the substrate.

10. An electronic foil as claimed in claim 1, wherein the at least one electrically conductive portion is arranged to extend up to a joint area comprising the mechanical fastening means in the foil.

11. An electronic device comprising at least one electronic foil as claimed in claim 1.

12. A joining arrangement comprising at least one electronic foil as claimed in claim 1, wherein the at least one tab in the electronic foil is inserted into the at least one opening in the same electronic foil so that the mechanical fastening takes place between the at least one edge of the tab and the at least one edge of the opening, wherein the at least one tab snaps into the at least one opening and the electronic foil is arranged to provide a three-dimensional structure, and wherein at least one electrically conductive portion in the electronic foil is connected electrically to another electrically conductive portion in the same foil, and electrically conductive adhesive material is arranged between the electrically conductive portions, the adhesive material ensuring electrical connection between the electrically conductive portions.

13. A joining arrangement as claimed in claim 12, wherein anisotropic adhesive material is arranged between the electrically conductive conductors positioned opposite to each other so as to ensure an electrical connection between the oppositely positioned conductive conductors.

14. A joining arrangement comprising at least one electronic foil as claimed in claim 1, wherein the mechanical fastening means in the electronic foil are fastened to an object providing a counterpart for the electronic foil, and wherein at least one tab is inserted into at least one opening so that the mechanical fastening takes place between at least one edge of the tab and at least one edge of the opening, wherein the at least one tab snaps into the at least one opening, and wherein the electronic foil and the counterpart object are arranged to at least partly overlap each other, at least one electrically conductive portion in the electronic foil is connected electrically to another electrically conductive portion in the object providing the counterpart for the electronic foil, and electrically conductive adhesive material is arranged between the electrically conductive portions, the adhesive material ensuring electrical connection between the electrically conductive portions.

15. A joining arrangement as claimed in claim 14, wherein the joining arrangement comprises a joining part intended for joining the electronic foil and the object providing the counterpart for the electronic foil to each other, the joining part comprising fastening means compatible with the fastening means in the electronic foil and the counterpart object, the joining part at least partly overlapping the joint area in the electronic foil and the counterpart object, the joining part providing both the mechanical connection and the electrical connection between the electronic foil and the counterpart object.

16. A joining arrangement as claimed in claim 14, wherein the object intended to provide the counterpart for the electronic foil is another electronic foil comprising a flexible substrate and at least one electrically conductive portion arranged to the substrate, the foil comprising mechanical fastening means for mechanical fastening of the electronic foil, wherein the mechanical fastening means are part of the substrate of the electronic foil and comprise at least one tab and/or at least one opening arranged through the substrate, the at least one tab and/or the at least one opening comprising edges by which the mechanical fastening takes place.

17. A method for joining at least one electronic foil as claimed in claim 1, wherein the mechanical fastening means in the electronic foil are fastened to another mechanical fastening means in the same electronic foil, wherein the electronic foil provides a three-dimensional structure, and wherein at least one electrically conductive portion in the electronic foil is connected electrically to another electrically conductive portion in the same foil, and electrically conductive adhesive material is arranged between the electrically conductive portions, the adhesive material ensuring electrical connection between the electrically conductive portions.

18. A method for joining at least one electronic foil as claimed in claim 1, wherein the mechanical fastening means in the electronic foil are fastened to an object providing a counterpart for the electronic foil, and wherein the electronic foil and the counterpart object are arranged to at least partly overlap each other, at least one electrically conductive portion in the electronic foil is connected electrically to another electrically conductive portion in the object providing the counterpart for the electronic foil, and electrically conductive adhesive material is arranged between the electrically conductive portions, the adhesive material ensuring electrical connection between the electrically conductive portions.

* * * * *